(12) United States Patent
Sugahara et al.

(10) Patent No.: US 7,397,071 B2
(45) Date of Patent: Jul. 8, 2008

(54) TUNNEL TRANSISTOR HAVING SPIN-DEPENDENT TRANSFER CHARACTERISTICS AND NON-VOLATILE MEMORY USING THE SAME

(75) Inventors: Satoshi Sugahara, Kanagawa (JP); Masaaki Tanaka, Saitama (JP)

(73) Assignee: Japan Science and Technology Agency, Kawaguchi (JP)

( * ) Notice: Subject to any disclaimer, the term of this patent is extended or adjusted under 35 U.S.C. 154(b) by 54 days.

(21) Appl. No.: 10/551,802

(22) PCT Filed: Mar. 30, 2004

(86) PCT No.: PCT/JP2004/004512

§ 371 (c)(1), (2), (4) Date: Dec. 2, 2005

(87) PCT Pub. No.: WO2004/088753

PCT Pub. Date: Oct. 14, 2004

(65) Prior Publication Data
US 2006/0118839 A1    Jun. 8, 2006

(30) Foreign Application Priority Data
Mar. 31, 2003 (JP) ............................. 2003-095600

(51) Int. Cl.
*H01L 29/70* (2006.01)

(52) U.S. Cl. ...................................... 257/213; 257/E43
(58) Field of Classification Search .................. 257/15, 257/197, E43; 438/312
See application file for complete search history.

(56) References Cited

U.S. PATENT DOCUMENTS 5,457,335 A * 10/1995 Kuroda et al. ............... 257/318
5,659,499 A *  8/1997 Chen et al. .................. 365/158

(Continued)

FOREIGN PATENT DOCUMENTS

JP          A 11-238924          8/1999

(Continued)

OTHER PUBLICATIONS

LeClair. et al., "Large magnetoresistance using hybrid spin filter devices", Applied Physics Letters, Jan. 28, 2002, vol. 80, No. 4, pp. 625 to 627.*

(Continued)

*Primary Examiner*—Kenneth Parker
*Assistant Examiner*—Jami M Valentine
(74) *Attorney, Agent, or Firm*—Oliff & Berridge, PLC

(57) ABSTRACT

A MISFET the channel region of which is a ferromagnetic semi-conductor has a feature that the drain current can be controlled by the gate voltage and a feature that the transfer conductance can be controlled by the relative directions of magnetization in the ferromagnetic channel region and the ferromagnetic source (or the ferromagnetic drain, or both the ferromagnetic source and ferromagnetic drain). As a result, binary information can be stored in the form of the relative magnetization directions, and the relative magnetization directions are electrically detected. If the magnetism is controlled by the electric field effect of the channel region of a ferromagnetic semiconductor, the current needed to rewrite the information can be greatly reduced. Thus, the MISFET can constitute a high-performance non-volatile memory cell suited to high-density integration.

63 Claims, 18 Drawing Sheets

U.S. PATENT DOCUMENTS

| | | | |
|---|---|---|---|
| 5,874,760 | A * | 2/1999 | Burns et al. .................. 257/315 |
| 6,069,820 | A | 5/2000 | Inomata et al. |
| 6,753,562 | B1 * | 6/2004 | Hsu et al. .................... 257/295 |
| 2002/0006058 | A1 * | 1/2002 | Nakajima et al. ............ 365/171 |
| 2004/0041217 | A1 * | 3/2004 | Lee et al. ..................... 257/414 |
| 2004/0141367 | A1 * | 7/2004 | Amano et al. ................ 365/158 |
| 2005/0117617 | A1 * | 6/2005 | Yoshida et al. ................. 372/44 |
| 2006/0043443 | A1 * | 3/2006 | Sugahara et al. ............. 257/295 |

FOREIGN PATENT DOCUMENTS

| | | |
|---|---|---|
| JP | A 2001-250998 | 9/2001 |
| JP | A 2003-78147 | 3/2003 |
| JP | A 2003-092412 | 3/2003 |

OTHER PUBLICATIONS

Filip et al., "Spin-injection device based on EuS magnetic tunnel barriers" Applied Physics Letters, vol. 81, No. 10, pp. 1815-1817, Sep. 2, 2002.*

LeClair et al., "Large Magnetoresistance using Hybrid Spin Filter Devices," Applied Physics Letters, vol. 80, No. 4, pp. 625-627, Jan. 28, 2002.

Matsukura et al.,."Control of Ferromagnetism in Filed-Effect Transistor of a Magnetic Semiconductor," Physica E, vol. 12, pp. 351-355, 2002.

Sugawara et al., "Proposal of a Spin-Filter Transistor and its Application," 30a-ZH-1, No. 3, pp. 1566, Mar. 27, 2003 with English translation.

Matsuno et al., "Reconfigurable Logic Devices Based on the Spin-Filter Transistor," 30a-ZH-2, No. 3, pp. 1566, Mar. 27, 2003 with English translation.

Datta et al., "Electronic Analog of the Electro-Optic Modulator," Appl. Phys. Lett., vol. 56, No. 7., pp. 665-667. Feb. 12, 1990.

Inomata, "Present and Future of Magnetic RAM Technology," IEICE Trans. Electron., vol. E84-C, No. 6, pp. 740-746, Jun. 2001.

Ohno et al., "Electric-Field Control of Ferromagnetism," Nature, vol. 408, pp. 944-946, Dec. 21-28, 2000.

Chiba et al., "Electrical Manipulation of Magnetization Reversal in a Ferromagnetic Semiconductor," Science, vol. 301, pp. 943-945, Aug. 15, 2003.

* cited by examiner

FIG. 3B  PARALLEL MAGNETIZATION

FIG. 3C  ANTIPARALLEL MAGNETIZATION (a)

(b)

TUNNEL TRANSISTOR HAVING SPIN-DEPENDENT TRANSFER CHARACTERISTICS AND NON-VOLATILE MEMORY USING THE SAME

FIELD OF THE INVENTION

The present invention relates to novel transistors, and more particularly, to a transistor with spin-dependent transfer characteristics and a non-volatile memory circuit (a non-volatile memory) using the transistor.

BACKGROUND OF THE INVENTION

Recent developments in the advanced information society are remarkable, and further rapid developments can be found in "mobile devices". The great demand for the "mobile devices" is regarded as a possible main factor in future semiconductor industries. However, in addition to the existing demands for high-speed operations, low power consumption, and high capacities of semiconductor integrated circuits, there are new demands for non-volatility of information. In such a trend, attention has been drawn toward a novel memory device that has been developed by combining an excellent ferromagnetic storage technique and semiconductor integration electronics for non-volatile high-density recording (disclosed in Non-Patent Document 1, for example). This device is called a magneto-resistive random access memory (hereinafter referred to as "MRAM"), and a magnetic tunnel junction (hereinafter referred to as "MTJ") having a thin insulating tunnel barrier interposed between ferromagnetic electrodes is used as a memory element.

A MTJ has a tunneling magneto-resistance (hereinafter referred to as "TMR") effect with which the tunnel resistance varies with the relative magnetization direction between the ferromagnetic electrodes. Accordingly, using the MTR effect, the magnetization configuration of a ferromagnetic member can be electrically detected. With a MTJ, the non-volatile information using ferromagnetic members can be positively applied to the semiconductor integration electronics.

Referring now to FIG. 8, an example of the prior art is described. As shown in FIG. 8, an MRAM memory cell 100 has a 1-bit memory cell formed with a MTJ 101 and a MOS transistor 103. The MTJ 101 is a tunnel junction that includes a first ferromagnetic electrode 105, a second ferromagnetic electrode 107, and a tunnel barrier 108 formed with an insulator interposed between the two electrodes.

The source (S) of the MOS transistor 103 is grounded (GND), and the drain (D) is connected to the ferromagnetic electrode 107 of the MTJ 101 with a plug PL. The ferromagnetic electrode 105 of the MTJ 101 is connected to a bit line BL. A rewrite word line 111 is disposed to cross the bit line at right angles, while being electrically insulated from the MTJ 101 and the other lines by an insulating film 115 immediately above or below the MTJ 101. A read word line WL is connected to the gate electrode G of the MOS transistor 103.

Since the magnetization directions can be maintained in a non-volatile manner in a ferromagnetic member, a MTJ can store binary information in a non-volatile manner by switching the relative magnetization configuration of the ferromagnetic electrodes to parallel magnetization or antiparallel magnetization. Also, in a MTJ, the tunnel resistance varies in accordance with the relative magnetization configuration between the two ferromagnetic electrodes due to the TMR effect. Accordingly, utilizing the tunnel resistance in accordance with the magnetization configuration that switches between parallel magnetization and antiparallel magnetization, the magnetization configuration of the MTJ can be electrically detected.

Information rewrite is performed by making the coercive forces of the two ferromagnetic electrodes 105 and 107 different from each other in the MTJ 101, or inverting the magnetization of the ferromagnetic electrode with the smaller coercive force or with an unfixed magnetization direction while fixing the magnetization direction of the other ferromagnetic electrode. Hereinafter, a ferromagnetic member having a magnetization direction to be inverted will be referred to as a free layer, and a ferromagnetic member having a magnetization direction not to be inverted will be referred to as a pin layer. More specifically, currents are applied to the bit line BL and the rewrite word line 111 that cross each other on a selected memory cell. Using the synthetic magnetic field of the magnetic fields induced by the currents, only the magnetization configuration of the MTJ 101 in the selected memory cell 100 is switched to parallel magnetization or antiparallel magnetization. Here, the values of the currents to be applied to the lines are set so that the magnetization of the MTJ 101 of each unselected memory cell connected to the bit line BL and the rewrite word line 111 to which the selected memory cell is connected is not inverted only through one of the bit line BL and the rewrite word line 111.

Information is read out by energizing the MOS transistor 103 through application of a voltage to the read word line WL connected to the selected cell, and then applying a read driving current to the MTJ 101 via the bit line BL. Since the tunnel resistance varies in accordance with the magnetization configuration that can be switched between parallel magnetization and antiparallel magnetization due to the TMR effect in the MTJ 101, the magnetization configuration of the MTJ 101 can be determined by detecting a voltage decrease (hereinafter referred to as "output voltage") due to the read driving current in the MTJ 101. The following is the documents relating to the above described techniques.

1) K. Inomata, "Present and Future of Magnetic RAM Technology", IEICE Trans. Electron., Vol. E84-C, 2001, pp. 740-746.

2) H. Ohno, D. Chiba, F. Matsukura, T. Omiya, E. Abe, T. Dietl, Y. Ohno, and K. Otani, "Electric-Field Control of Ferromagnetism", Nature, Vol. 408, 2000, pp. 944-946. (also described later)

3) D. Chiba, M. Yamanouchi, F. Matsukura, and H. Ohno, "Electrical Manipulation of Magnetization Reversal in a Ferromagnetic Semiconductor", Science, Vol. 301, 2003, pp. 943-945. (also described later)

DISCLOSURE OF THE INVENTION (1) Information Reading

The problems with information (data) reading from a MRAM mainly derive from MTJs. A MTJ has a binary resistance value that depends on whether the relative magnetization configuration between the ferromagnetic electrodes interposing a tunnel barrier is parallel or antiparallel. So as to detect the binary data with a driving current with high sensitivity, it is necessary to optimize the output voltage by adjusting the impedance (the junction resistance) of the MTJ.

Furthermore, so as to read out the contents of stored information with high precision, it is necessary to set a high output signal ratio between the two magnetization configurations of parallel magnetization and antiparallel magnetization. Therefore, the change rate in the TMR (also referred to as the TMR ratio) in each of the cases of parallel magnetization and antiparallel magnetization needs to be made higher in the MTJ.

The TMR ratio depends on the spin polarization rate P of the ferromagnetic electrodes. So as to increase the TMR ratio, a ferromagnetic material with a large P value needs to be employed for the ferromagnetic electrodes.

The TMR ratio in a MTJ also depends on the voltage to be applied to the MTJ, and greatly decreases with a decrease of the voltage. When a high driving current is applied to a MTJ to read out information at a high speed, the voltage decrease becomes larger in the MTJ, and the TMR ratio drops. In other words, a high TMR ratio is traded for high-speed performance. Therefore, it is necessary to provide the TMR ratio with a bias resistance so as to prevent the TMR ratio from dropping with a large voltage decrease in the MTJ.

In view of the above facts, a memory element to be used for a MRAM preferably has an output that greatly depends whether the relative magnetization configuration is parallel magnetization or antiparallel magnetization. In the case of parallel magnetization or antiparallel magnetization configuration, the memory element preferably generates a sufficiently large output that does not depend on a bias to be applied to the device.

(2) Information Rewrite

In a MRAM, information is rewritten by changing the magnetization configuration of a MTJ through a magnetic field induced by the current flowing through the bit line and the word line. With MRAMs, high-density integration and high performance can be realized through miniaturization of devices as in a conventional semiconductor integrated memory. However, as MTJs are miniaturized, the demagnetizing field of each ferromagnetic electrode becomes larger, and the field intensity required for magnetization inversion becomes higher. Accordingly, the current required for rewrite becomes higher. The current increase is so large that the reliability of the lines cannot be maintained as the lines are miniaturized, even if an aspect ratio is increased as much as possible. The field intensity required for rewrite can be lowered by reducing the coercive force of the ferromagnetic members. However, fatal errors such as false write are caused in such a case.

Therefore, it is necessary to employ a method of rewriting magnetization information through a magnetic field generated by a low current value, without a decrease in the coercive force of each ferromagnetic body used in the memory element.

(3) High-Density Integration

A MRAM is suitable for high-density integration, because it has a simple structure and a MTJ can be reduced to a nano-scale size. So as to achieve high integration with several gigabits or greater, the channel length of each MOS transistor is expected to be 0.1 µm or shorter. However, when miniaturized MTJs in conformity with such miniaturized transistors are to be integrated, the contacts and the multilayer lines occupy the cell area, resulting in difficulty of integrating them with a high density.

Therefore, memory cells with simpler structures suitable for high-density integration are desired.

An object of the present invention is to provide a novel transistor that can control the output characteristics according to the magnetization configuration of a ferromagnetic member contained in the transistor. Another object of the present invention is to provide a large-capacity, high-performance non-volatile memory in which each 1-bit memory cell is formed only with the transistor.

The first aspect of the present invention provides a transistor that includes: a source (a ferromagnetic source) that is made of a ferromagnetic material and injects conduction carriers; a drain that receives the conduction carriers injected from the ferromagnetic source; a tunnel barrier (a ferromagnetic tunnel barrier) that is disposed between the ferromagnetic source and the drain, which is made of a ferromagnetic material; and a gate electrode that is formed in relation to the ferromagnetic tunnel barrier, and controls the carrier conduction from the ferromagnetic source to the drain by inducing an electric field in the ferromagnetic tunnel barrier. In this transistor, the energy band edge of the conduction band in the ferromagnetic tunnel barrier is spin-split in a case where the conduction carriers are electrons. In a case where the conduction carriers are holes, the energy band edge of the valence band in the ferromagnetic tunnel barrier is spin-split.

In a case where the magnetization direction of the ferromagnetic tunnel barrier is the same as the magnetization direction of the ferromagnetic source (parallel magnetization) or the direction of the major spin in the ferromagnetic source is parallel to the spin direction at the spin split, the tunneling probability of the major-spin electrons as the conduction carriers of the ferromagnetic source tunneling the ferromagnetic tunnel barrier is preferably controlled by the voltage (a gate voltage) to be applied to the gate electrode. For example, in the case where the ferromagnetic source and the ferromagnetic tunnel barrier exhibit the parallel magnetization, the gate voltage is applied to the ferromagnetic tunnel barrier so as to reduce the effective thickness of the tunnel barrier. By doing so, the ferromagnetic tunnel barrier has such a thickness as to generate a current that causes the major-spin electrons of the ferromagnetic source to tunnel the ferromagnetic tunnel barrier.

Meanwhile, in a case where the magnetization direction of the ferromagnetic tunnel barrier is opposite to the magnetization direction of the ferromagnetic source (antiparallel magnetization) or the direction of the major spin in the ferromagnetic source is antiparallel to the spin direction at the spin-split energy band edge of the ferromagnetic tunnel barrier, the barrier height of the ferromagnetic tunnel barrier in relation to the major spin in the ferromagnetic source is higher by the width of the spin split at the energy band edge. As a result, the tunnel current generated between the ferromagnetic source and the drain is smaller than the tunnel current generated in the case of parallel magnetization. Accordingly, even with the same biases being applied, the mutual (trans) conductance varies in accordance with the relative magnetization direction between the ferromagnetic source and the ferromagnetic tunnel barrier.

The first aspect of the present invention also provides a memory circuit that includes: transistors that are arranged in a matrix fashion; first lines that ground the ferromagnetic sources; word lines that are collectively connected to the gate electrodes of the transistors aligned in the column direction; and bit lines that are collectively connected to the drains of the transistors aligned in the row direction.

The memory circuit may further include first extra lines and second extra lines that cross each other at right angles on the transistors, and are electrically insulated from each other. Also, the first extra lines and the second extra line may be replaced with the word lines and the bit lines. Alternatively, either the first extra lines or the second extra lines may be replaced with either the word lines or the bit lines.

In the above memory circuit, information stored in accordance with the magnetization direction can be rewritten by inverting the magnetization of the ferromagnetic source or the ferromagnetic tunnel barrier so as to change the relative magnetization configuration between the ferromagnetic source and the ferromagnetic tunnel barrier, using a magnetic field induced by applying current to the first extra line and the second extra line, or the word line and the bit line replacing the first extra line and the second extra line, or either the first extra line or the second extra line, or the word line or the bit line replacing either the first extra line or the second extra line and the first extra line or the second extra line, whichever is not replaced.

Information can be read out based on the output characteristics of the transistor in a case where a first bias is applied to the word line and a second bias is applied between the first line and the bit line.

The above memory circuit may further include: an output terminal formed at one end of each of the bit lines; and second lines that branch out from the bit lines and are connected to a power source via a load. In this case, information can be read out in accordance with an output voltage representing the voltage decrease in the load due to the current generated between the power source and the first line via the load and the transistor, with a first bias being applied to the word line.

Using the above circuit, a non-volatile memory circuit that is suitable for high-density integration and can have an output voltage that is formed with a power source and a load and varies in accordance with the magnetization configuration in the transistor can be provided.

Since the spin selecting rate in the ferromagnetic tunnel barrier in the transistor in accordance with the first aspect of the present invention, the change rate of current between parallel magnetization and antiparallel magnetization can be made higher. Furthermore, the single transistor serves as a non-volatile memory cell. Accordingly, a memory circuit using the above transistor can eliminate the above described problems in data reading and high-density integration.

The second aspect of the present invention provides a transistor that includes: a ferromagnetic semiconductor layer; a source that injects carriers into the ferromagnetic semiconductor layer; a drain that receives the carriers injected into the ferromagnetic semiconductor layer; and a gate electrode that applies a voltage for controlling the conduction of the carriers from the source to the drain. In this transistor, either one of the source and the drain is a ferromagnetic source or a ferromagnetic drain that includes a tunnel barrier (a "non-magnetic tunnel barrier") that is made of a non-magnetic material and is joined to the semiconductor layer, and an electrode (a "ferromagnetic electrode") that is made of a ferromagnetic material and is joined to the non-magnetic tunnel barrier. In the case where the source is the ferromagnetic source, the drain is a non-magnetic drain that includes a non-magnetic tunnel barrier joined to the semiconductor layer, and an electrode (a "non-magnetic electrode") that is made of a non-magnetic material and is joined to the non-magnetic tunnel barrier. In the case where the drain is the ferromagnetic drain, the source is a non-magnetic source that includes a non-magnetic tunnel barrier joined to the semiconductor layer, and a non-magnetic electrode joined to the non-magnetic tunnel barrier. Further, each of the source and the drain may include a non-magnetic tunnel barrier joined to the semiconductor layer, and a ferromagnetic electrode joined to the non-magnetic tunnel barrier. Each of the ferromagnetic source and the ferromagnetic drain may include a tunnel barrier (a "ferromagnetic tunnel barrier") that is made of a ferromagnetic material and is joined to the ferromagnetic semiconductor layer, and a non-magnetic electrode that is joined to the ferromagnetic tunnel barrier. In the case where the carriers are electrons, the energy barrier by the ferromagnetic tunnel barrier or the non-magnetic tunnel barrier is formed at least on the side of the conduction band. In the case where the carriers are holes, the energy barrier is formed at least on the side of the valence band.

The second aspect of the present invention also provides a memory circuit that includes: transistors that are arranged in a matrix fashion; ground lines that are collectively connected to the sources of the transistors aligned in the column direction; word lines that are collectively connected to the gate electrodes of the transistors aligned in the column direction; and bit lines that are collectively connected to the drains of the transistors aligned in the row direction.

The information stored in a transistor selected through the word line and the bit line can be rewritten by applying a first voltage to the bit line and the ground line so that the ferromagnetic semiconductor layer changes from a ferromagnetic state with large coercive force to a first state that is a paramagnetic state or a ferromagnetic state with sufficiently small coercive force, applying a current to the word line to induce such a magnetic field as to change the magnetization direction of the ferromagnetic semiconductor layer in the first state, and then cutting off the application of the first voltage or applying a second voltage so as to return the ferromagnetic semiconductor layer to the ferromagnetic state with large coercive force.

Information rewrite can also be performed by applying such a voltage to the bit line and the ground line that the ferromagnetic semiconductor layer is put into to a demagnetized state, applying a current to the word line to induce such a magnetic field as to magnetize the ferromagnetic semiconductor layer, and utilizing the initial magnetization characteristics after the application of the first voltage is cut off.

The information stored in a transistor selected through the word line and the bit line can be read out based on the intensity of a current flowing between the word line and the ground line, in a case where predetermined voltages are applied to the bit line and the word line, with the ground line being the reference.

The second aspect of the present invention also provides a memory circuit that includes: the transistors that are arranged in a matrix fashion; ground lines that are collectively connected to the sources of the transistors aligned in the row direction; word lines that are respectively connected to the gate electrodes of the transistors aligned in the column direction; and bit lines that are collectively connected to the drains of the transistors aligned in the row direction. In this circuit, the information stored in the transistors that are connected to the bit line and the ground line can be collectively rewritten by applying a first voltage to the bit line and the ground line so that the ferromagnetic semiconductor layer changes from a ferromagnetic state with large coercive force to a first state that is a paramagnetic state or a ferromagnetic state with sufficiently small coercive force, applying a current simultaneously to the word lines to induce such a magnetic field as to change the magnetization direction of the ferromagnetic semiconductor layer in the first state, and then cutting off the application of the first voltage or applying a second voltage so as to return the ferromagnetic semiconductor layer to the ferromagnetic state with the large coercive force.

The features of the memory circuit using the transistors in accordance with the second aspect of the present invention are as follows:

1) Information Write

A ferromagnetic semiconductor can be changed from a ferromagnetic state to a paramagnetic state by reducing the number of carriers in the ferromagnetic semiconductor layer through application of an electric field. This is called the field-effect magnetism control (see Non-Patent Documents 2 and 3). In a memory cell employing the transistor in accordance with the second aspect of the present invention, a voltage is applied to the source and the drain, so as to change the channel region from a ferromagnetic state to a paramagnetic state (or a state with sufficiently small coercive force). In this situation, magnetization inversion is performed. Accordingly, rewrite can be performed with a sufficiently small magnetic field by virtue of the coercive force in the ferromagnetic state. Also, the number of carriers in the ferromagnetic semiconductor is reduced by applying a bias to the source and the drain. By doing so, the ferromagnetic semiconductor can be demagnetized. After the application of a bias is cut off, a magnetic field is applied to the demagnetized ferromagnetic semiconductor, and the ferromagnetic semiconductor is magnetized in accordance with the initial magnetization. Thus, the magnetization information can be rewritten with a smaller magnetic field than the coercive force in the ferromagnetic state.

2) Information Reading

In the transistor in accordance with the second aspect of the present invention, the magnetization configuration is read out through a conduction phenomenon that is similar to the tunneling magneto-resistance (TMR) effect between the ferromagnetic semiconductor layer as the channel and the ferromagnetic source (or between the ferromagnetic semiconductor layer and the ferromagnetic drain). The bias applied between the source and the drain is divided at the source junction and the drain junction. Accordingly, in the device in accordance with the present invention, the output signal (the drain current) ratio between parallel magnetization and antiparallel magnetization exhibits lower bias dependence than the output signal ratio obtained with a conventional MTJ. In this device, a read bias higher than the bias in a MTJ can be applied. Particularly, in a case where the source is made of a ferromagnetic material, the bias dependence is remarkably lower.

3) High-Density Integration

In accordance with the second aspect of the present invention, a 1-bit memory cell is formed with the single transistor alone. Accordingly, a very simple structure can be formed with respect to the lines. Thus, a layout that is suitable for miniaturization can be easily formed.

A memory cell using the conventional MRAM has a 1-MTJ, 1-transistor, 4-line structure (see FIG. 8). Therefore, it is difficult to reduce the cell area by sharing a source between two adjacent cells, due to the existence of the MTJ and the write word line. With the memory cells in accordance with the present invention, on the other hand, a cell structure in which a source can be shared by two adjacent cells can be formed.

BRIEF DESCRIPTION OF THE DRAWINGS

FIG. 3B shows the energy band structure in a case where a gate voltage is applied and the ferromagnetic source and the ferromagnetic tunnel barrier exhibit parallel magnetization;

FIG. 3C shows the energy band structure in a case where a gate voltage is applied and the ferromagnetic source and the ferromagnetic tunnel barrier exhibit antiparallel magnetization;

DESCRIPTION OF THE PREFERRED EMBODIMENTS

Figure 1:
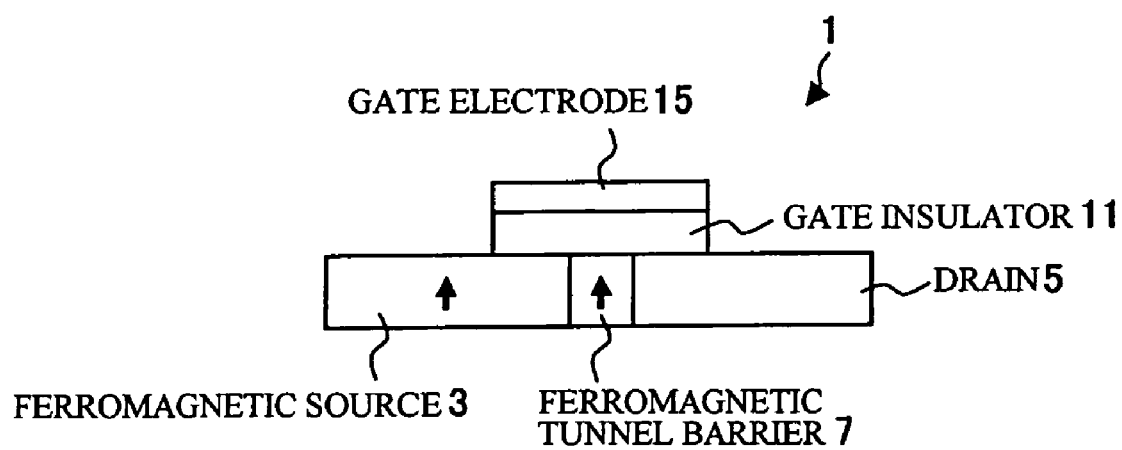
FIG. 1 is a schematic cross-sectional view of a transistor in accordance with a first embodiment of the present invention.

A transistor in accordance with a first aspect of the present invention is a novel transistor that utilizes the spin-dependent tunnel effect caused by the junction between a ferromagnetic source and a ferromagnetic tunnel barrier. More specifically, the transistor is formed with a tunnel junction structure having an insulating ferromagnetic tunnel barrier interposed between a ferromagnetic source and a drain, and a gate electrode that is formed in relation to the ferromagnetic tunnel barrier and can induce an electric field in the ferromagnetic tunnel barrier.

Although the term "spin" is generally used for spin angular momentum, it will also refer to carriers with predetermined spin directions in the following description. The magnetization direction of each ferromagnetic tunnel barrier is determined by the spin direction of the spin band at the energy band edge (for example, if the band edge of a conduction band is spin-split, the magnetization direction is opposite to the spin direction of the spin band at the energy band edge of the ferromagnetic tunnel barrier).

Since the up-spin band and the down-spin band are spin-split at the band edge of the ferromagnetic tunnel barrier, the barrier height of the tunnel barrier seen from the ferromagnetic source varies between the up spin and the down spin. Accordingly, the tunneling probability of the ferromagnetic tunnel barrier depends on the spin direction of the carriers in the ferromagnetic source. A gate voltage is applied to the ferromagnetic tunnel barrier to change the potential shape of the ferromagnetic tunnel barrier. By doing so, the tunneling probability is changed, and the tunnel current generated between the ferromagnetic source and the drain is controlled. Accordingly, the size of the tunnel current depends on the spin direction of the spin band at the energy band edge of the ferromagnetic tunnel barrier in relation to the spin direction of the major-spin electrons in the ferromagnetic source. In other words, the size of the tunnel current depends on the relative magnetization direction between the ferromagnetic source and the ferromagnetic tunnel barrier.

The magnetization in a case where the spin direction of the major-spin electrons in the ferromagnetic source is the same as the spin direction of the spin band at the energy band edge of the ferromagnetic tunnel barrier is referred to as "parallel magnetization", while the magnetization in a case where those spin directions are opposite to each other is referred to as "antiparallel magnetization". In the case of parallel magnetization, the barrier height of the ferromagnetic tunnel barrier seen from the major-spin electrons of the ferromagnetic source is low, and a drain current can be easily generated by a gate voltage. In the case of antiparallel magnetization, on the other hand, the barrier height of the ferromagnetic tunnel barrier seen from the major-spin electrons of the ferromagnetic source is high, and the drain current is lower than the drain current in the case of parallel magnetization, even if the same bias as the bias applied in the case of parallel magnetization is applied. Accordingly, the above transistor has mutual (trans) conductance that varies in accordance with the relative magnetization direction between the ferromagnetic source and the ferromagnetic tunnel barrier.

The above transistor stores information by changing the relative magnetization direction between the ferromagnetic source and the ferromagnetic tunnel barrier with a magnetic field or the like, and is capable of electrically reading out the stored information by virtue of the transfer characteristics of the transistor. Thus, a 1-bit non-volatile memory cell can be formed with the above transistor alone.

Based on the above discussion, embodiments of the present invention will be described below in conjunction with the accompanying drawings. First, a transistor in accordance with a first embodiment of the present invention is described.

FIG. 1 is a cross-sectional view of an example structure of the transistor in accordance with the first embodiment of the present invention. As shown in FIG. 1, the transistor 1 in accordance with this embodiment includes a tunnel function structure and a control electrode structure. The tunnel junction structure includes the functions among a ferromagnetic source 3, a ferromagnetic tunnel barrier 7, and a drain 5. The control electrode structure includes a gate insulating film 11 and a gate electrode 15 formed in relation with the ferromagnetic tunnel barrier 7, and can apply an electric field to the ferromagnetic tunnel barrier 7. The tunnel junction structure and the control electrode structure constitute the transistor 1.

The ferromagnetic source is made of a ferromagnetic metal such as Ni, Co, Fe, and permalloy, or an electrically conductive ferromagnetic semiconductor such as a semiconductor containing GaMnAs, magnetic elements, or the likes. The ferromagnetic tunnel barrier is made of an insulating ferromagnetic semiconductor such as EuS, or a ferromagnetic insulator such as garnet. Alternatively, a ferromagnetic semiconductor that contains magnetic elements and exhibits insulation may be used for the ferromagnetic tunnel barrier. The drain may be made of a non-magnetic metal such as Al, Au, and non-magnetic silicide, or an electrically conductive non-magnetic semiconductor such as doped Si and GaAs. However, in a case where a ferromagnetic semiconductor and a non-magnetic semiconductor are used for the ferromagnetic source and the drain, respectively, the ferromagnetic semiconductor and the non-magnetic semiconductor need to have the same conductivity type.

If a ferromagnetic metal or an n-type ferromagnetic semiconductor is used for the ferromagnetic source, the conduction carriers serve as electrons, and the ferromagnetic tunnel barrier needs to have a spin-split bottom as the bottom of the conduction band. If a p-type ferromagnetic semiconductor is used for the ferromagnetic source, the conduction carriers serve as holes, and the top of the valence band in the ferromagnetic tunnel barrier needs to be spin-split.

Figure 2A:
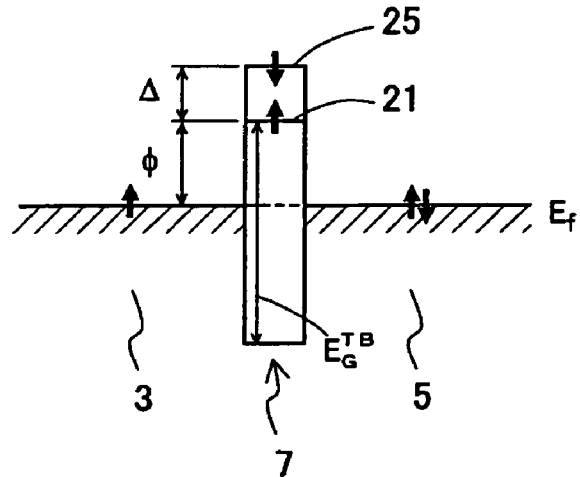
FIG. 2A shows the energy band structure in a case where the ferromagnetic source of the transistor of FIG. 1 is made of a ferromagnetic metal.

FIG. 2A illustrates an example of the energy band structure that is observed in a case where the ferromagnetic source and the drain of the transistor shown in FIG. 1 are formed with a ferromagnetic metal and a non-magnetic metal, respectively. The solid lines on the ferromagnetic source 3 and the drain 5, and the broken line on the ferromagnetic tunnel barrier 7 indicate Fermi energy $E_f$. The two adjacent solid lines 21 and 25 at the bottom of the conduction band of the ferromagnetic tunnel barrier 7 indicate the band edges of the up-spin band and the down-spin band, respectively.

The upward-pointing arrows and the downward pointing arrow in the drawing indicate the up spin and the down spin. The arrow shown over the Fermi energy $E_f$ of the ferromagnetic source indicates the orientation of the major-spin electrons, and the orientation of the minor-spin electrons is not shown. Likewise, an upward-pointing arrow and a downward-pointing arrow indicate the up-spin band edge 21 and the down-spin band edge 25 in the ferromagnetic tunnel barrier 7. In the drain 5, the two aligning upward-pointing and downward-pointing arrows shown on the Fermi energy $E_f$ indicate that the drain 5 is a non-magnetic body. (In the other drawings, the upward-pointing and downward-pointing arrows in each region will imply the same as the above.)

In the drawing, $\Delta$ indicates the spin-split width between the up-spin band edge 21 and the down-spin band edge 25. The barrier height of the ferromagnetic tunnel barrier 7 in relation to the ferromagnetic source 3 differs between the up spin and the down spin, and the greater height is denoted by $\phi$. More specifically, the difference between the Fermi energy $E_f$ of the ferromagnetic source 3 and the energy at the bottom of the spin band with the lowest energy in the conduction band in the ferromagnetic tunnel barrier 7 is denoted by $\phi$.

Figure 2B:
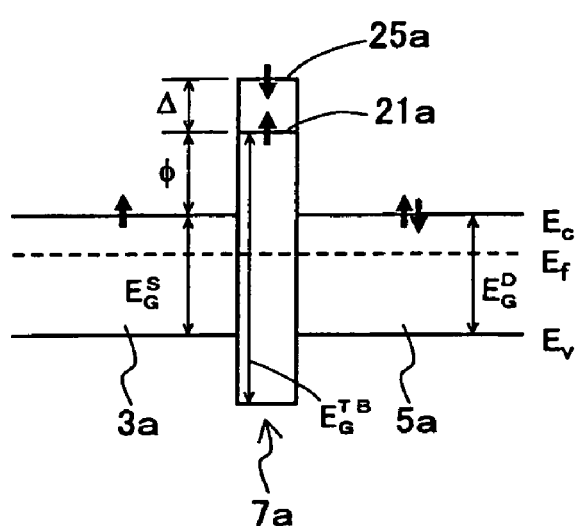
FIG. 2B shows the energy band structure in a case where the ferromagnetic source is an n-type ferromagnetic semiconductor.

FIG. 2B illustrates an energy band structure that is observed in a case where the ferromagnetic source 3 and the drain 5 of the transistor 1 shown in FIG. 1 are formed with an n-type ferromagnetic semiconductor and an n-type non-magnetic semiconductor, respectively. The solid lines $E_c$ on the ferromagnetic source 3a and the drain 5a indicate the energy at the bottom of the conduction band. The broken line shown across the ferromagnetic source 3a, the drain 5a, and the ferromagnetic tunnel barrier 7a indicates Fermi energy $E_f$.

As in the example shown in FIG. 2A, $\Delta$ indicates the spin-split width between the up-spin band edge 21a and the down-spin band edge 25a in the ferromagnetic tunnel barrier, and the difference between the energy at the bottom of the conduction band of the ferromagnetic source 3a and the energy at the bottom of the spin band with the lowest energy in the conduction band in the ferromagnetic tunnel barrier 7a is denoted by $\phi$. In FIG. 2B, a non-degenerate ferromagnetic semiconductor and a non-magnetic semiconductor are employed. However, it is also possible to employ a degenerate ferromagnetic semiconductor and a non-magnetic semiconductor for the ferromagnetic source 3a and the drain 5a, respectively.

Figure 2C:
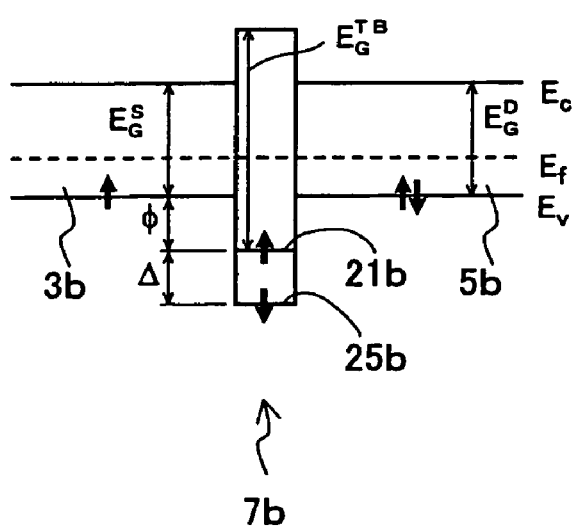
FIG. 2C shows the energy band structure in a case where the ferromagnetic source is a p-type ferromagnetic semiconductor.

FIG. 2C illustrates an energy band structure that is observed in a case where the ferromagnetic source 3 and the drain 5 of the transistor shown in FIG. 1 are formed with a p-type ferromagnetic semiconductor and a p-type non-magnetic semiconductor, respectively. The solid line $E_v$ on the ferromagnetic source 3b and the drain 5b indicates the energy at the top of the valence band. The broken line shown across the ferromagnetic source 3b, the drain 5b, and the ferromagnetic tunnel barrier 7b indicates Fermi energy. The two adjacent solid lines existing at the top of the valence band of the ferromagnetic tunnel barrier 7b indicate the band edges of the up-spin band 21b and the down-spin band 25b, respectively. In FIG. 2C, $\Delta$ indicates the spin-split width between the up-spin band 21b and the down-spin band 25b. The difference between the energy at the top of the valence band of the ferromagnetic source 3b the energy at the top of the spin band with the highest energy in the valence band in the ferromagnetic tunnel barrier 7b is denoted by $\phi$. In the example shown in FIG. 2C, a non-degenerate ferromagnetic semiconductor and a non-magnetic semiconductor are employed. However, it is also possible to employ a degenerate ferromagnetic semiconductor and a non-magnetic semiconductor for the ferromagnetic source 3b and the drain 5b, respectively.

The magnetization in the case where the direction of the major spin in the ferromagnetic source 3 is the same as the spin direction of the spin band that is the band edge of the ferromagnetic tunnel barrier 7 in FIG. 1 is "parallel magnetization". The magnetization in the case where those spin directions are opposite to each other is "antiparallel magnetization". The barrier thickness of the ferromagnetic tunnel barrier in relation to the major spin in the ferromagnetic source is $\phi$ in the case of parallel magnetization, but is $\phi+\Delta$ in the case of antiparallel magnetization. Accordingly, the magnetization direction of the tunnel barrier 7 in relation to the ferromagnetic source 3 is changed from parallel magnetization to antiparallel magnetization by applying a magnetic field, for example. By doing so, the barrier height with respect to the major spin in the ferromagnetic source can be increased from $\phi$ to $\phi+\Delta$.

The thickness of the gate insulating film 11 should preferably be so thin as to change the potential of the ferromagnetic tunnel barrier with a voltage applied to the gate electrode, and should also preferably be so thick as not to cause leakage current (such as tunnel current) between the gate electrode 15 and the ferromagnetic source 3 or the drain 5 at the time of gate voltage application.

In the case where the ferromagnetic source and the ferromagnetic tunnel barrier exhibit parallel magnetization, the thickness of the ferromagnetic tunnel barrier is designed to be so thick as to cause almost no current due to a tunneling effect such as direct tunneling from the source to the drain or Fowler-Nordheim tunneling (hereinafter referred to as the "FN tunneling") when only a bias $V_{DS}$ is applied between the ferromagnetic source 3 and the drain 5. With this structure, when a bias $V_{GS}$ is applied between the gate electrode 15 and the ferromagnetic source 3, the potential shape caused by the application of $V_{DS}$ at the band edge of the ferromagnetic tunnel barrier 7 is changed to cause a tunnel current.

Figure 3A:
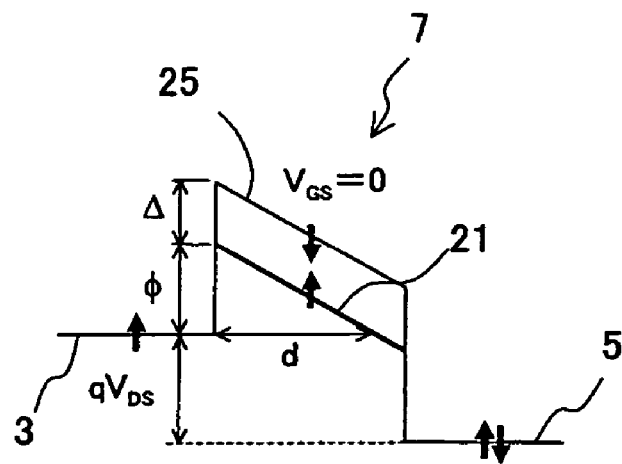
FIG. 3A illustrates the operation principle of the transistor of this embodiment, showing the energy band structure in a case where a gate voltage is not applied.
Figure 3A:
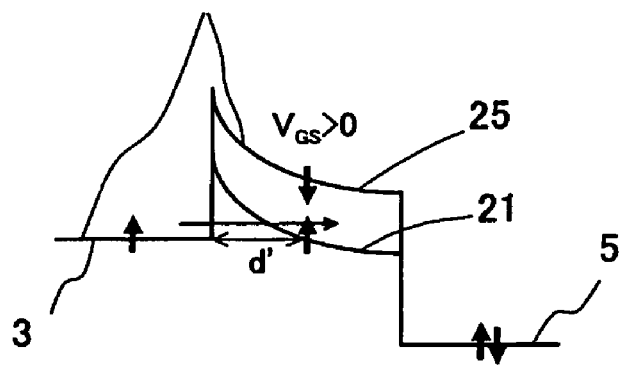
Figure 3A:
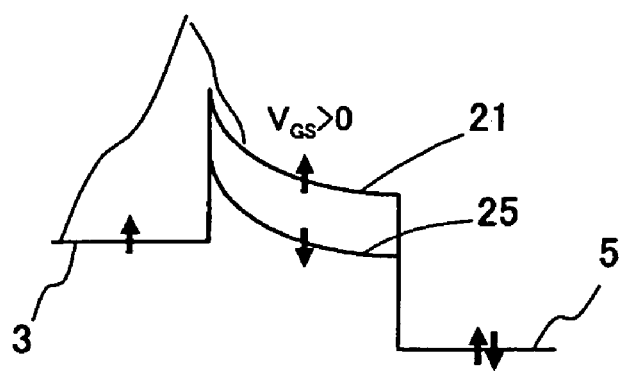

In the following, the operation of the transistor in accordance with this embodiment is described in detail, with reference to FIGS. 3A through 3C. In the example case described below, a ferromagnetic metal is used for the ferromagnetic source and the conduction carriers are electrons, as shown in FIG. 2A. If the ferromagnetic source 3 and the ferromagnetic tunnel barrier 7 exhibit parallel magnetization, the spin band of the spins parallel to the major spin in the ferromagnetic source 3 is the band edge of the ferromagnetic tunnel barrier 7. Therefore, the barrier height seen from the major-spin electrons in the ferromagnetic source 3 is $\phi$. When the bias $V_{DS}$ is applied only between the source 3 and the drain 5, the potential of the ferromagnetic tunnel barrier 7 changes from the rectangular form shown in FIG. 2A to the shape shown in FIG. 3A or a similar form to that. Here, the bias $V_{DS}$ is of such a size that a current caused by the FN tunneling hardly flows. More specifically, even if the Fermi energy of the ferromagnetic source 3 crosses the band edge of the ferromagnetic tunnel barrier 7 due to the application of $V_{DS}$, the distance d from the interface between the ferromagnetic source and the ferromagnetic tunnel barrier to the crossing point between the Fermi energy of the ferromagnetic source and the band edge of the ferromagnetic tunnel barrier is as long as not to cause FN tunneling.

When the bias $V_{GS}$ (>0) is applied to the gate electrode, the electric field in the vicinity of the interface between the ferromagnetic source and the ferromagnetic tunnel barrier is intensified by the electric flux line from the gate electrode to the ferromagnetic source. The potential shape shown in FIG. 3B is then formed. If the width of the potential barrier is reduced from the distance d, with which tunneling is hardly caused, to a distance d' with which tunneling can be caused, the ferromagnetic tunnel barrier 7 can transmit the major-spin electrons of the ferromagnetic source 3. Thus, a drain current is generated between the ferromagnetic source 3 and the drain 5. Meanwhile, the barrier height in relation to the minor-spin electrons of the ferromagnetic source 3 is greater than $\phi$ by $\Delta$, and the carrier density of the minor-spin electrons is low. Therefore, the drain current generated by the minor-spin electrons is low. Accordingly, the drain current is equal to the sum of the tunnel current generated by the major-spin electrons and the tunnel current generated by the minor-spin electrons of the ferromagnetic source 3. However, if the size of $\Delta$ is sufficiently large, the tunnel current generated by the major-spin electrons becomes dominant.

Since the tunneling probability dramatically increases with a decrease of the width of the tunnel barrier due to the bias $V_{GS}$, the drain current ID greatly varies even with a minute change in the bias $V_{GS}$. Accordingly, high mutual (trans) conductance can be achieved.

In the case where the ferromagnetic source and the ferromagnetic tunnel barrier exhibit antiparallel magnetization as shown in FIG. 3C, the barrier height in relation to the major spin in the ferromagnetic source is $\phi+\Delta$, and the barrier height in relation to the minor-spin electrons of the ferromagnetic source is $\phi$. Accordingly, in the case of antiparallel magnetization, the tunneling probability of the major-spin electrons is low even though the same biases $V_{DS}$ and $V_{GS}$ as those in the example case shown in FIG. 3B are applied, and drain current is hardly generated. As the barrier height of the ferromagnetic tunnel barrier 7 in relation to the minor-spin electrons of the ferromagnetic source 3 is $\phi$, the tunneling probability in relation to the minor-spin electrons is high. However, since the carrier density of the minor-spin electrons is low, the drain current generated by the tunneling of the minor-spin electrons is low. Accordingly, the drain current is also equal to the total current generated by the major-spin electrons and the minor-spin electrons of the ferromagnetic source in the case of antiparallel magnetization. However, the total current is lower than the total current obtained in the case of parallel magnetization. For this reason, the mutual (trans) conductance in the case of antiparallel magnetization is low.

Figure 4:
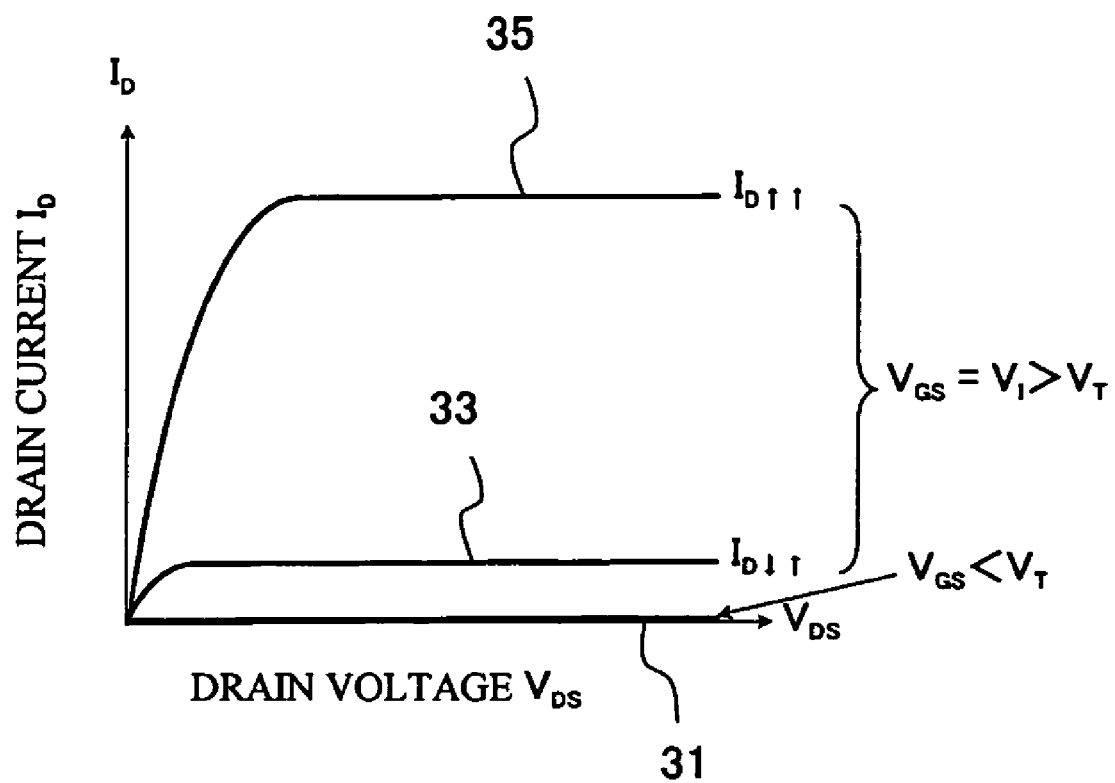
FIG. 4 shows the output characteristics of the transistor shown in FIG. 1 and FIGS. 2A through 2C.

Referring now to FIG. 4, the current-voltage characteristics of the transistors shown in FIG. 1 through FIG. 3C are described. FIG. 4 conceptually shows the $V_{DS}$ dependence of the drain current $I_D$ of the transistor 1 having $V_{GS}$ as a parameter. In the case where the ferromagnetic source 3 and the ferromagnetic tunnel barrier 7 exhibit parallel magnetization, the bias $V_{GS}$ that generates a predetermined drain current is set as $V_\uparrow$. In the case of parallel magnetization, $V_{GS}=V_\uparrow$ that is greater than $V_\uparrow$ (>$V_\uparrow$) is applied to the gate electrode, a drain current ($I_{D\uparrow\uparrow}$) 35 is generated by the tunneling of the major-spin electrons of the ferromagnetic source 3, since the barrier height of the tunnel barrier in relation to the major-spin electrons of the ferromagnetic source is low as described above, and the effective width of the tunnel barrier is reduced by the gate voltage. As the effective width of the tunnel barrier can be controlled by adjusting the size of $V_{GS}$, the drain current 35 can be controlled also by adjusting $V_{GS}$.

If changes in the potential shape in the vicinity of the interface between the ferromagnetic source and the ferromagnetic tunnel barrier are caused by changes in the electric field mainly due to the gate voltage when $V_{GS}$ is applied, the tunneling probability hardly depends on $V_{DS}$, and the drain current exhibits saturation characteristics with respect to $V_{DS}$, as shown in FIG. 4.

Meanwhile, in the case where the ferromagnetic source and the ferromagnetic tunnel barrier exhibit antiparallel magnetization, the barrier height of the tunnel barrier in relation to the major-spin electrons of the ferromagnetic source is high ($\phi+\Delta$), and the tunneling probability is low. The barrier height in relation to the minor-spin electrons is low ($\phi$), and the tunneling probability is high, but the carrier density is low. Accordingly, in the case of antiparallel magnetization, a drain current ($I_{D\downarrow\uparrow}$) 33 that is lower than the drain current in the case of parallel magnetization is generated even if $V_{GS}$ is equal to V1 (>$V_\uparrow$).

The above described transistor has such characteristics that a drain current can be controlled with a gate voltage. Also, the mutual conductance is high in the case where the relative magnetization between the ferromagnetic source 3 and the ferromagnetic tunnel barrier 7 is parallel magnetization, and the mutual conductance is low in the case where the relative magnetization is antiparallel magnetization.

A ferromagnetic structure can maintain magnetization directions unless a magnetic field greater than its coercive force is induced externally. Accordingly, the above described transistor can store binary information in a non-volatile manner by switching the relative magnetization of the ferromagnetic source 3 and the ferromagnetic tunnel barrier 7 between parallel magnetization and antiparallel magnetization. For example, the coercive force of the ferromagnetic source 3 and the coercive force of the ferromagnetic tunnel barrier 7 are made different from each other, or the magnetization direction of either the ferromagnetic source 3 or the ferromagnetic tunnel barrier 7 is fixed, so that the information of "0" can be stored by setting parallel magnetization between the ferromagnetic source 3 and the ferromagnetic tunnel barrier 7 using a magnetic field or the like generated by a signal line, and the information of "1" can be stored by setting antiparallel magnetization. As described above, this transistor can electrically detect the relative magnetization between the ferromagnetic source 3 and the ferromagnetic tunnel barrier 7, based on the size of the drain current or the size of the mutual (trans) conductance. Accordingly, a one-bit non-volatile memory cell can be formed with the above described transistor alone.

Figure 5:
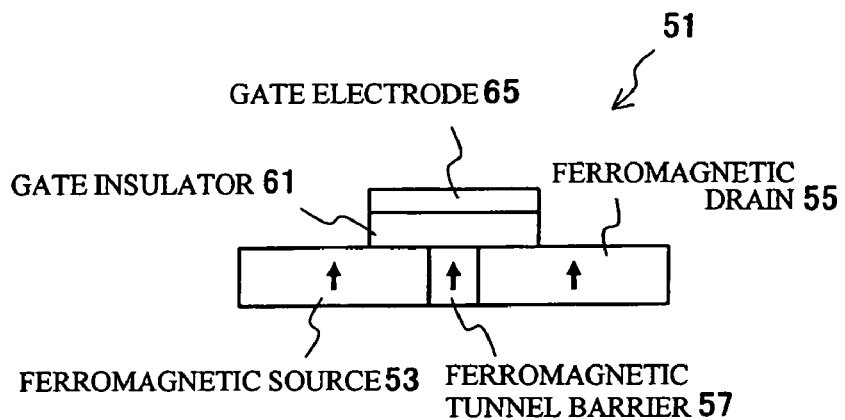
FIG. 5 is a cross-sectional view illustrating an example structure of a transistor in accordance with a second embodiment of the present invention.

FIG. 5 is a cross-sectional view illustrating an example structure of a transistor in accordance with a second embodiment of the present invention. As shown in FIG. 5, the transistor 51 in accordance with this embodiment includes a tunnel junction structure and a control electrode structure. The tunnel junction structure has a ferromagnetic tunnel barrier 57 sandwiched between a ferromagnetic source 53 and a ferromagnetic drain 55. The control electrode structure that includes a gate insulating film 61 and a gate electrode that are formed in relation to the ferromagnetic tunnel barrier 57, and can induce en electric field in the ferromagnetic tunnel barrier 57. The tunnel junction structure and the control electrode structure constitute the transistor 51.

An electrically conductive ferromagnetic material such as a ferromagnetic metal and a ferromagnetic semiconductor with electric conductivity are employed for the ferromagnetic source 53 and the ferromagnetic drain 55. An insulating ferromagnetic material such as an insulating ferromagnetic semiconductor is employed for the ferromagnetic tunnel barrier 57. However, if ferromagnetic semiconductors are employed as the ferromagnetic source and the ferromagnetic drain, those two ferromagnetic semiconductors need to have the same conductivity. Specific examples of the materials are the same as those in the first embodiment.

Also, as in the first embodiment, in a case where a ferromagnetic metal or an n-type ferromagnetic semiconductor is employed for the ferromagnetic source 53, the conduction carriers serve as electrons, and the bottom of the conduction band of the ferromagnetic tunnel barrier need to be spin-split. In a case where a p-type ferromagnetic semiconductor is used as the ferromagnetic source 53, the conduction carriers serve as holes, and the top of the valence band of the ferromagnetic tunnel barrier 57 needs to be spin-split.

In the band structure in accordance with the second embodiment, the drain that is the same as the drain of the band structure shown in FIG. 2 should be made of a ferromagnetic material. In the second embodiment, $\Delta$ and $\phi$ can be determined in the same manner as in the first embodiment. If the direction of the major spin in the ferromagnetic source 53 is the same as the spin direction of the spin band at the energy band edge of the ferromagnetic tunnel barrier 57, the magnetization configuration is parallel. If the spin directions are opposite to each other, the magnetization configuration is antiparallel. The magnetization of the ferromagnetic drain 55 may be the same as the magnetization of either the pin layer or the free layer (i.e., either the ferromagnetic source or the ferromagnetic tunnel barrier).

Especially in the transistor in accordance with the second embodiment, the ferromagnetic source 53 and the ferromagnetic drain 55 can be made of the same material, and accordingly, the process of manufacturing the transistor can be greatly simplified.

Next, a tunnel transistor in accordance with a third embodiment of the present invention is described. The transistor in accordance with this embodiment differs from the transistor of the first embodiment in that the ferromagnetic source is made of a half-metal ferromagnetic material (hereinafter referred to as "half metal"). A half metal exhibits a metallic band structure for one direction of spins, while exhibiting an insulating (or semi-conductive) spin band structure for the opposite direction of spins. Accordingly, the carriers of one direction serve as conduction carriers. If the spin direction of the conduction carriers (the spin direction of the carriers in the metallic spin band) in the half metal is the same as the spin direction of the spin band at the band edge of the ferromagnetic tunnel barrier, the magnetization configuration is parallel. It the spin directions are opposite to each other, the magnetization configuration is antiparallel. In the case of parallel magnetization, the spins belonging to the metallic spin band of the ferromagnetic source pass through the tunnel barrier of $\phi$ in height, and then generate a drain current. In the case of antiparallel magnetization, there are no conduction carriers with spins of $\phi$ in barrier height, because the ferromagnetic source is made of a half metal (with a ferromagnetic source made of a ferromagnetic metal described above, the conduction carriers are minor-spin electrons). As long as the band gap of the insulating spin band of the half metal is sufficiently wide and the half metal is sufficiently thick, carrier injection with such spins that can tunnel the ferromagnetic tunnel barrier from an external non-magnetic contact is hardly caused. Since the barrier height of the ferromagnetic tunnel barrier is $\phi+\Delta$ in relation to the spins belonging to the metallic spin band of the half metal, the tunnel probability in relation to the spins is low, and the drain current generated by the conduction carriers can be made so small as to be ignored if $\Delta$ is sufficiently large. In view of the above facts, with the ferromagnetic source made of a half metal, the difference in drain current between parallel magnetization and antiparallel magnetization can be made dramatically large. It is also possible to form both the ferromagnetic source and the ferromagnetic drain with half metals, as in the transistor in accordance with the second embodiment. Examples of half metals include $CrO_2$, $Fe_3O_4$, and Heusler's alloy. Also, ferromagnetic semiconductors with zinc blendestructures such as MnAs, CrAs, and CrSb, and ferromagnetic semiconductors with electronic structures that serve as half metals may be employed.

Figure 6:
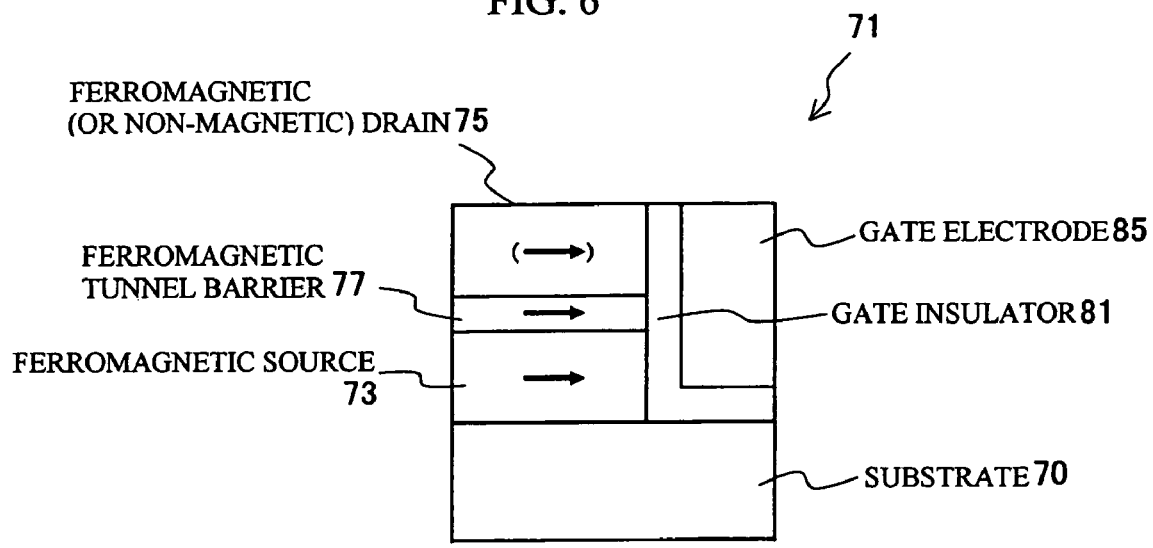
FIG. 6 is a cross-sectional view of an example structure of a transistor in accordance with a fourth embodiment of the present invention.

Next, a transistor in accordance with a fourth embodiment of the present invention is described in conjunction with FIG. 6. FIG. 6 is a cross-sectional view illustrating the structure of the transistor in accordance with the fourth embodiment of the present invention. While the transistors in accordance with the first through third embodiments are planar transistors, the transistor in accordance with the fourth embodiment is formed by turning a transistor of any of the foregoing embodiments into a vertical transistor.

As shown in FIG. 6, the transistor 71 in accordance with this embodiment is a stacked structure that includes a substrate 70, a ferromagnetic source 73 formed on the substrate 70, a ferromagnetic tunnel barrier 77, and a ferromagnetic or non-magnetic drain 75. The side surfaces of the components of the stacked structure are partially or entirely covered with a gate insulating film 81. The transistor 71 further includes the gate insulating film 81 and a gate electrode 85 that can apply an electric field to the ferromagnetic tunnel barrier 77 via the gate insulating film 81.

As this structure is a stacked structure of the ferromagnetic source 73, the ferromagnetic tunnel barrier 77, and the ferromagnetic or non-magnetic drain 75 stacked in the normal direction of the surface of the substrate 70, a series of junctions among the ferromagnetic source 73, the ferromagnetic tunnel barrier 77, and the ferromagnetic or non-magnetic drain 75 can be formed by a thin-film growth method with excellent controllability on film thickness. Accordingly, the ferromagnetic tunnel barrier 77 can be formed with high precision.

In each of the transistors of the first through fourth embodiments, a non-magnetic material may be interposed between the ferromagnetic source and the ferromagnetic tunnel barrier, so as to prevent magnetic coupling between the ferromagnetic source and the ferromagnetic tunnel barrier.

Next, memory circuits (a non-volatile memory) each having transistors of one of the first through fourth embodiments as a memory element, and the operations of such memory circuits are described in conjunction with the accompanying drawings.

The transistor of any of the first through fourth embodiments of the present invention is a transistor that can control the drain current by adjusting the gate voltage as in a case of a field-effect transistor such as a MOS transistor, and also has transfer characteristics (mutual conductance) that depend on the magnetization configuration of the ferromagnetic members that can hold magnetization information in the transistor in a non-volatile manner. Accordingly, the transistor alone can form a 1-bit memory cell. Also, the output voltage of the transistor can be arbitrarily set in accordance with the peripheral circuits (loads and the power source).

Figure 7A:
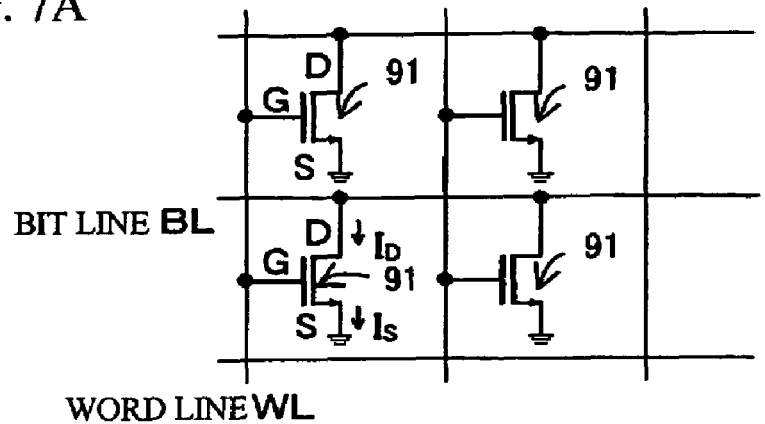
FIGS. 7A and 7B illustrates memory circuits in accordance with a fifth embodiment and a sixth embodiment of the present invention, with one of the transistors in accordance with the first through fourth embodiments of the present invention being employed in each of the memory circuits.
Figure 7B:
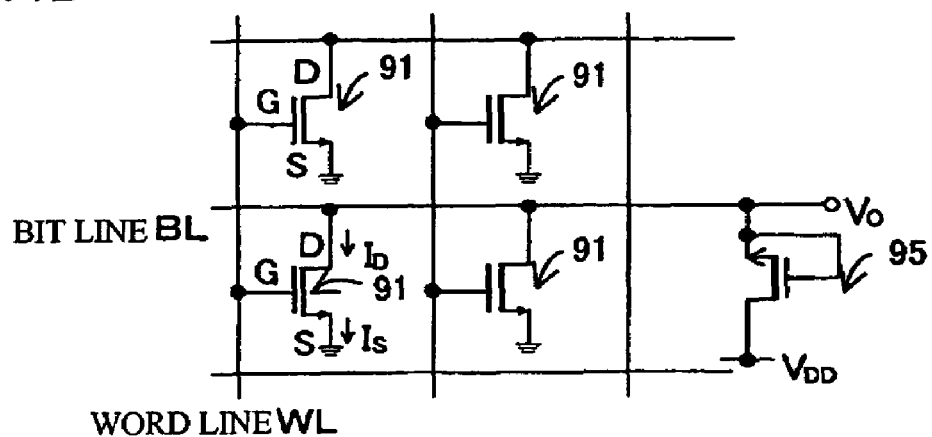

FIGS. 7A and 7B illustrate memory circuits in accordance with fifth and sixth embodiments of the present invention. These memory circuits each have one of transistors in accordance with one of the first through fourth embodiments of the present invention. As shown in FIG. 7A, a memory circuit in accordance with this embodiment has a number of transistors 91 that have sources (S) grounded, and are arranged in a matrix fashion. The drain (D) and the gate (G) of each of the transistor 91 are connected to a read bit line BL and a read word line WL, respectively. Also, each rewrite word line crosses each rewrite bit line on the transistor, with each rewrite word line and each rewrite bit line being electrically insulated from other lines. The read bit lines and the read word lines may also serve as the rewrite word lines and the rewrite bit lines. FIGS. 7A and 7B shows such cell structures. In each of the structure, a memory cell can be formed with a single transistor, and the lines can have very simple structures.

Figure 8:
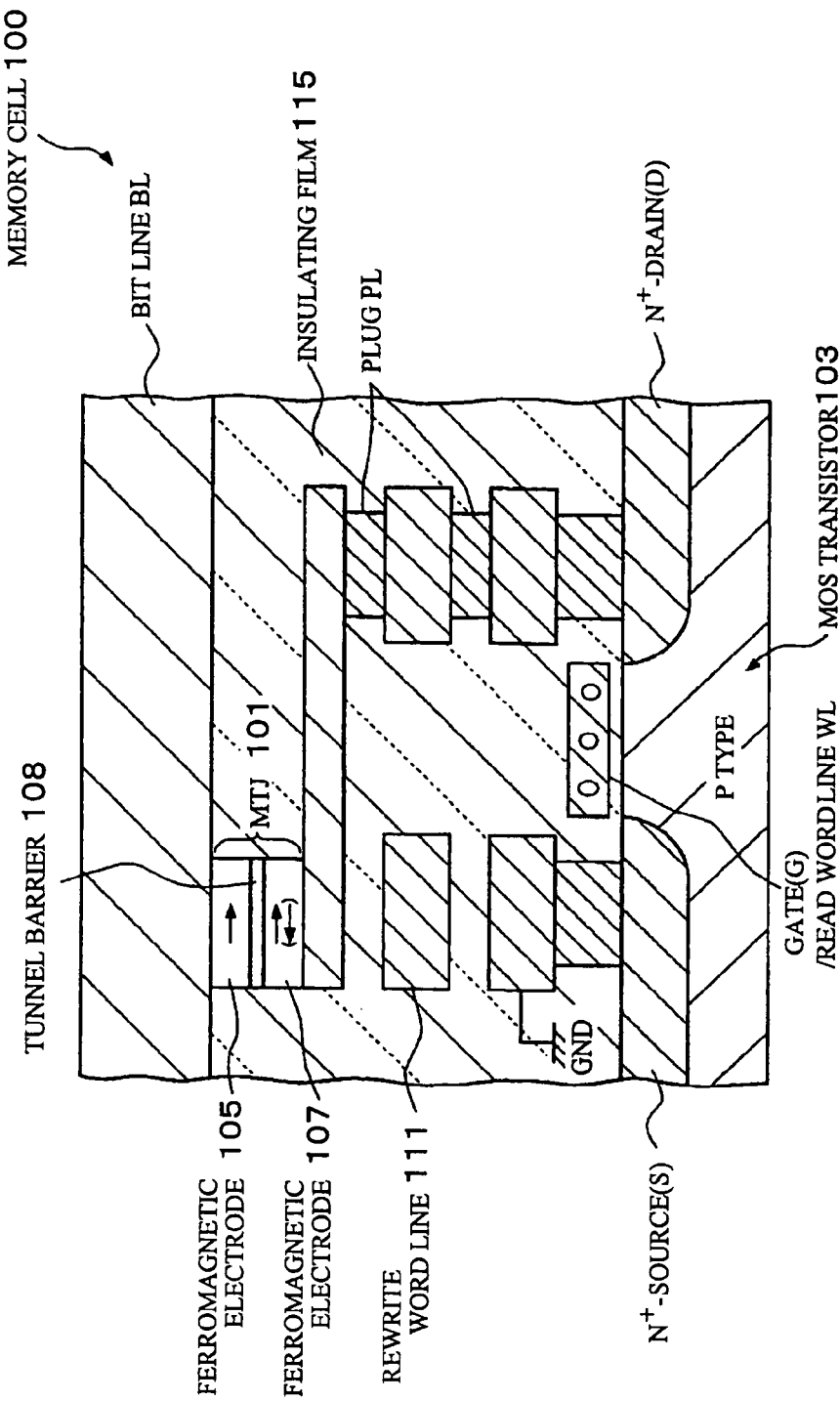
FIG. 8 is a cross-sectional view of a memory cell of a conventional MRAM using MTJ.

Next, the fifth embodiment of the present invention is described in greater detail, with reference to the accompanying drawings. A conventional MRAM has a 2-element, 4-line structure (see FIG. 8). In such a MRAM, it is difficult to reduce the cell area by sharing a source between adjacent cells, for example, due to the existence of MTJs and rewrite word lines. In this embodiment, on the other hand, each memory cell can be formed with a 1-element, 3-line structure (or a 1-element, 2-line structure) that is the simplest structure, as shown in FIG. 7A. Accordingly, a layout that is suitable for a miniaturization can be easily realized. For example, a source is shared to further reduce the size of each memory cell (later described).

In the following, the read bit lines and the read word lines also serve as the rewrite bit lines and the rewrite word lines, and the read/rewrite bit lines are referred to as bit lines BL while the read/rewrite word lines are referred to as word lines WL. Information is rewritten by varying the coercive force of the ferromagnetic source or the ferromagnetic tunnel barrier of each transistor 91 of this embodiment, or by switching the relative magnetization between the ferromagnetic source and the ferromagnetic tunnel barrier to parallel magnetization or antiparallel magnetization, with the magnetization direction of either one of the ferromagnetic source and the ferromagnetic tunnel barrier being fixed while the magnetization of the other being inverted. The magnetization configurations of parallel magnetization and antiparallel magnetization are represented by binary information of "0" and "1". More specifically, currents are applied to the bit line BL and the word line WL crossing each other on a selected cell, and the magnetization of the ferromagnetic member having the smaller coercive force or the ferromagnetic member having an unfixed magnetization direction in the selected memory cell is inverted by the composite magnetic field of the magnetic fields induced by the currents. Thus, information is stored.

The value of the current to be applied to each line is set so as not to cause magnetization inversion with the magnetic field generated only from one of the lines. By doing so, the unselected memory cells connected to the bit line BL and the word line WL to which the selected memory cell is connected are protected from magnetization inversion.

The information is read out by detecting the size of the drain current. The drain current detection is carried out by applying a voltage to the word line WL connected to the selected cell to energize the transistor of this embodiment, and then applying a voltage to the bit line BL. In the transistor of this embodiment, the mutual conductance is high and a high drain current is generated, when the relative magnetization configuration between the ferromagnetic source and the ferromagnetic tunnel barrier is parallel magnetization. In the case of antiparallel magnetization, however, the mutual conductance is low, and the drain current is also low. Accordingly, the relative magnetization configuration between the ferromagnetic source and the ferromagnetic tunnel barrier can be detected.

With a regular MTJ, the current is generated by the tunneling between the state densities of the major-spin electrons and the minor-spin electrons of both ferromagnetic electrodes in the parallel magnetization configuration. In the case of antiparallel magnetization, the current is generated by the tunneling from the state density of the minor-spin electrons to the state density of the major-spin electrons and the tunneling from the state density of the major-spin electrons to the state density of the minor-spin electrons. Accordingly, the current ratio between the parallel magnetization configuration and the antiparallel magnetization configuration becomes higher, as the spin polarization rate of the ferromagnetic electrodes becomes higher. However, since the current generated in the case of parallel magnetization contains current components generated by the minor-spin electrons, the current ratio between the parallel magnetization configuration and the antiparallel magnetization configuration cannot be easily made higher.

In the transistor in accordance with this embodiment, on the other hand, the drain current is generated only by the tunneling of the major-spin electrons of the ferromagnetic source in the case of parallel magnetization, because the band edge of the ferromagnetic tunnel barrier is spin-split. In the case of antiparallel magnetization, the drain current is generated only by the tunneling of the minor-spin electrons of the ferromagnetic source. Also, the ferromagnetic tunnel barrier exhibits high spin selectivity. Accordingly, in the transistor in accordance with this embodiment, the current ratio (the drain current ratio) between the parallel magnetization configuration and the antiparallel magnetization configuration can be made higher than the current ratio in the case with a MTJ. Thus, with the transistor in accordance with this embodiment, the magnetization configuration can be easily detected in the circuit.

In a conventional MTJ, the TMR ratio rapidly decreases when the bias voltage drops. As a result, the TMR ratio greatly decreases with the bias necessary for the circuit. With the transistor in accordance with this embodiment, such a problem is not caused. As the tunneling effect that depends on the spin direction due to FN tunneling is utilized in the transistor in accordance with this embodiment, the bias required for generating the FN tunneling can be adjusted with the barrier height or the film thickness of the tunnel barrier. Accordingly, a high drain current ratio can be achieved with the bias required for the circuit.

The tunnel structure that has the ferromagnetic tunnel barrier interposed between the ferromagnetic source and the ferromagnetic or non-magnetic drain (the two-terminal device of the transistor of any of the first through fourth embodiments minus the gate insulator and the gate electrode) may also be used as a two-terminal magnetoresistive device that can optimize the bias voltage to achieve a high TMR ratio.

Figure 7C:
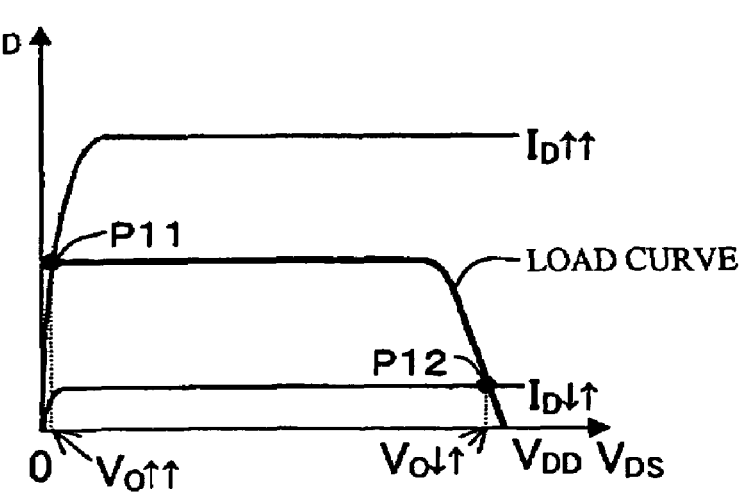
FIG. 7C shows the output characteristics of the memory circuit shown in FIG. 7B.

Next, the sixth embodiment of the present invention is described, with reference to the accompanying drawings. FIG. 7B illustrates a memory circuit that is the same as the memory circuit of FIG. 7A, except that the end of the bit line BL is connected to an output terminal $V_O$ and to a power supply $V_{DD}$ via a load branching out from the output terminal $V_O$. FIG. 7C shows the output characteristics of the memory circuit shown in FIG. 7B. Although an active load formed with a depletion MOS transistor is employed as the load in the memory circuit shown in FIG. 7B, a pure resistance may also be employed. As shown in FIG. 7C, as a bias $V_{GS}$ is applied to the gate electrode of the transistor and the supply voltage $V_{DD}$ is applied to the bit line BL via the load at the time of reading information, the operating point (P11 and P12 in FIG. 7C) due to the load moves on the load curve in accordance with the magnetization configuration between the ferromagnetic source and the ferromagnetic tunnel barrier. Accordingly, the output signals $V_O$ are represented by $V_{O\uparrow\uparrow}$ and $V_{O\downarrow\uparrow}$ in FIG. 7C. The absolute values of the output signals and the ratio ($V_{O\uparrow\uparrow}/V_{O\downarrow\uparrow}$) can be made appropriate by the peripheral circuits such as the load and the power supply $V_{DD}$. For example, a high output signal ratio can be obtained by optimizing the load curve even if the drain current ratio $I_{D\uparrow\uparrow}/I_{D\downarrow\uparrow}$ is low. Also, even if the values of $I_{D\uparrow\uparrow}$ and $I_{D\theta\uparrow}$ vary among the memory cells, the output voltage hardly varies, as long as the saturation current of the active load is higher than $I_{D\downarrow\uparrow}$ and is lower than $I_{D\uparrow\uparrow}$. Since a sense amplifier is not used for reading information, high-speed reading can be performed. Accordingly, the memory circuit in accordance with this embodiment is advantageous in that an output signal of a desired size can be easily obtained, and high-speed reading can be performed.

Figure 9:
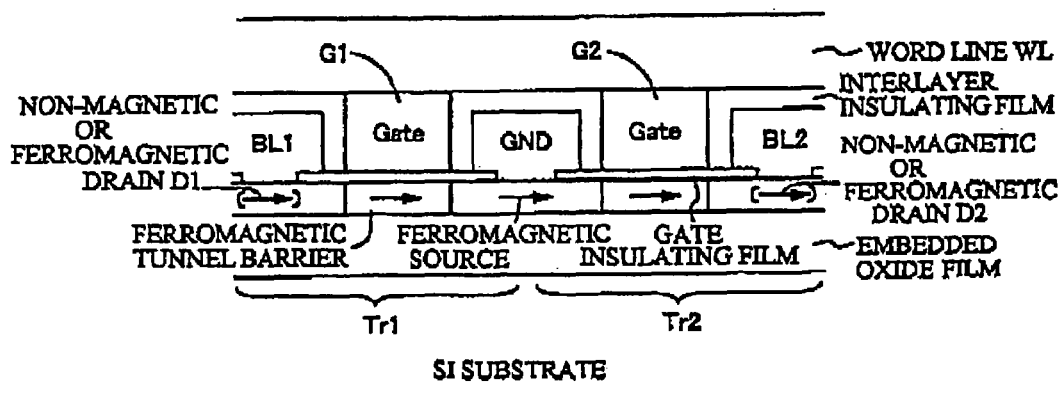
FIG. 9 is a cross-sectional view of an example structure of a memory cell having a shared ferromagnetic source.

It is also possible to form a memory cell structure that is suitable for high-density integration, having one source shared between two transistors of any of the first through third embodiments. FIG. 9 is a cross-sectional view illustrating an example of such a memory cell having a shared source. The memory cell structure shown in FIG. 9 includes: a first transistor Tr1 and a second transistor Tr2 that are the two transistors adjacent to each other; a word line WL to which the gate electrode G1 of the first transistor Tr1 and the gate electrode G2 of the second transistor Tr2 are connected; a first bit line BL1 to which the drain D1 of the first transistor Tr1 is connected; a second bit line BL2 to which the drain D2 of the second transistor Tr2 is connected; a ferromagnetic source S that is shared between the first transistor Tr1 and the second transistor Tr2; and a line (GND) that grounds the ferromagnetic source S. Memory cells each having this structure are arranged in a matrix fashion to achieve higher-density integration.

Figure 10:
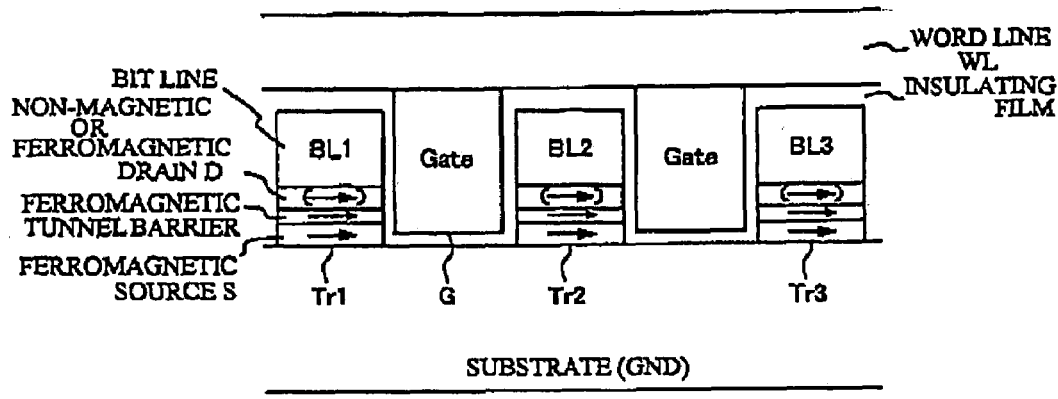
FIG. 10 is a cross-sectional view of an example structure of a memory cell using the transistor in accordance with the fourth embodiment of the present invention.

FIG. 10 is a cross-sectional view illustrating a memory cell structure in which transistors of the fourth embodiment (see FIG. 6) are employed. In this structure, the ferromagnetic sources S of the transistors that are arranged in a matrix fashion on a substrate or on a contact layer formed on the substrate are connected to one another and are grounded (GND). The transistors aligned in the row direction are connected to one another with the bit line that collectively connects the drains D of the transistors. The transistors aligned in the column direction are connected to one another with the word line that collectively connects the gate electrodes G of the transistors. With this structure, the integration density can be further increased.

Transistors each having a ferromagnetic tunnel barrier, a ferromagnetic source made of a ferromagnetic metal, a ferromagnetic semiconductor, or a half metal, and a ferromagnetic drain made of a ferromagnetic metal, a ferromagnetic semiconductor, or a half metal, have been described so far. However, the same effects can be achieved by forming a transistor that includes a ferromagnetic tunnel barrier, a source made of a non-magnetic conductor, and a ferromagnetic drain made of a ferromagnetic metal, a ferromagnetic semiconductor, or a half metal.

In a case of such a transistor that includes a non-magnetic source, a ferromagnetic tunnel barrier, and a ferromagnetic drain, the current ratio between the parallel magnetization configuration and the antiparallel magnetization configuration might be decreased by the bias between the source and the drain.

In the following, transistors based on the second aspect of the present invention and the application of the transistors to non-volatile memories are described. Each of the transistors is a metal-insulator-semiconductor field-effect transistor (MISFET) that has a ferromagnetic semiconductor serving as a channel region. A source and a drain are each designed to include a tunnel barrier joined to the ferromagnetic semiconductor layer as the channel region, and an electrode joined to the tunnel barrier. At least either one of the source and the drain includes a ferromagnetic material. Hereinafter, a source and a drain containing a ferromagnetic material will be referred to as a ferromagnetic source and a ferromagnetic drain, and a source and a drain made of a non-magnetic material will be referred to as a non-magnetic source and a non-magnetic drain. The ferromagnetic source and the ferromagnetic drain are each designed to include a tunnel barrier made of a non-magnetic material (a non-magnetic tunnel barrier) and an electrode made of a ferromagnetic material (a ferromagnetic electrode). Alternatively, the ferromagnetic source and the ferromagnetic drain may be each designed to include a tunnel barrier made of a ferromagnetic material (a ferromagnetic tunnel barrier) and an electrode made of a non-magnetic material (a non-magnetic electrode). These MISFETs can be roughly classified into seventh through ninth embodiments of the present invention, according to the structure of the ferromagnetic source and the ferromagnetic drain ((1) through (3) below).

(1) Ferromagnetic Electrode/Non-magnetic Tunnel Barrier Structure

Figure 11A:
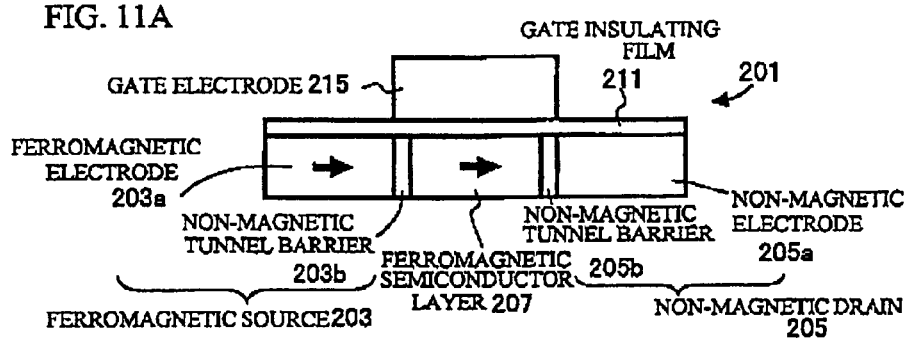
FIG. 11A illustrates the structure of a MISFET having a ferromagnetic semiconductor layer as a channel region in accordance with a seventh embodiment of the present invention.

FIG. 11A illustrates the structure of a MISFET in accordance with the seventh embodiment of the present invention. As shown in FIG. 11A, the MISFET in accordance with the seventh embodiment includes a MIS structure, a ferromagnetic source 203, and a non-magnetic drain 205. The MIS structure includes a gate electrode 215, a gate insulating film 211, and a ferromagnetic semiconductor layer 207 (in spite of the ferromagnetic semiconductor, this stacked structure is referred to as a MIS structure as in the case of a metal-insulator-semiconductor structure). The ferromagnetic source 203 includes a non-magnetic tunnel barrier 203*b* joined to the ferromagnetic semiconductor layer 207, and a ferromagnetic electrode 203*a* joined to the non-magnetic tunnel barrier 203*b*. The non-magnetic drain 205 includes a non-magnetic tunnel barrier 205*b* joined to the ferromagnetic semiconductor layer 207, and a non-magnetic electrode 205*a* joined to the non-magnetic tunnel barrier 205*b*. Although the combination of a ferromagnetic source and a non-magnetic drain is shown in FIG. 11A, it is also possible to form a ferromagnetic drain with a non-magnetic tunnel barrier and a ferromagnetic electrode, and a non-magnetic source with a non-magnetic tunnel barrier and a non-magnetic electrode. Alternatively, the source and the drain may be a ferromagnetic source and a ferromagnetic drain.

The ferromagnetic semiconductor layer 207 that forms the channel region is formed with a ferromagnetic semiconductor that contains magnetic elements at high concentration in the semiconductor as the base material. The ferromagnetic semiconductor layer 207 is formed through growth on a semiconductor substrate or a semiconductor layer (not shown), or by introducing magnetic atoms into the semiconductor through thermal diffusion or ion implantation. Alternatively, the ferromagnetic semiconductor layer 207 may be doped with magnetic elements so as to cause degeneracy, or so as not to cause degeneracy. Specific examples of the materials for the ferromagnetic semiconductor layer 207 include $Si_{1-x}M_x$, $Ge_{1-x}M_x$, $(SiGe)_{1-x}M_x$ (M being magnetic elements), which are ferromagnetic semiconductors doped with magnetic elements in semiconductors such as Si and Ge at high concentration. Examples of the materials for the ferromagnetic electrode to be the ferromagnetic source or the ferromagnetic drain (or both) include regular ferromagnetic metals (such as Fe, Ni, Permalloy, CoFe alloy, and CoFeB alloy), ferromagnetic semiconductors doped with magnetic elements at high concentration (such as $Si_{1-x}M_x$, $Ge_{1-x}M_x$, $(SiGe)_{1-x}M_x$ (M being magnetic elements), and half-metal ferromagnetic materials (such as magnetite, Heusler's alloy, $CrO_2$, and MnAs, CrAs, and MnSb having zinc blendestructures). The ferromagnetic electrodes used for the ferromagnetic source and the ferromagnetic drain may be grown or deposited on the ferromagnetic semiconductor layer 207, but may also be formed by introducing magnetic atoms into the semiconductor through thermal diffusion or ion implantation. So as to form a non-magnetic electrode, it is possible to use a non-magnetic metal (such as Al, PdSi alloy, or ErSi alloy), or a conduction-controlled non-magnetic semiconductor (such as Si, Ge, or SiGe alloy). As for the non-magnetic tunnel barriers, a non-magnetic insulator (such as a Si oxide, a Si nitride, an Al oxide, or a Ta oxide) or a non-magnetic semiconductor such as SiC can be employed. The MIS structure can be formed with a MOS structure in which the surface of the ferromagnetic semiconductor layer is oxidized, or with a structure produced by growing or depositing the insulating layer (such as a Si oxide, an Al oxide, or Hf oxide) 211 on the ferromagnetic semiconductor layer 207. The substrate is a regular semiconductor substrate or a SOI substrate. The MISFET 201 in accordance with this embodiment is of an accumulation channel type, with the conduction carriers being of the same conductivity type as the ferromagnetic semiconductor layer 207 serving as the channel region. Although the carriers may be either electrons or holes, the energy band structure in a case of an n-channel device will be described in the following. However, the same structure can be employed for a p-channel device.

Figure 11B:
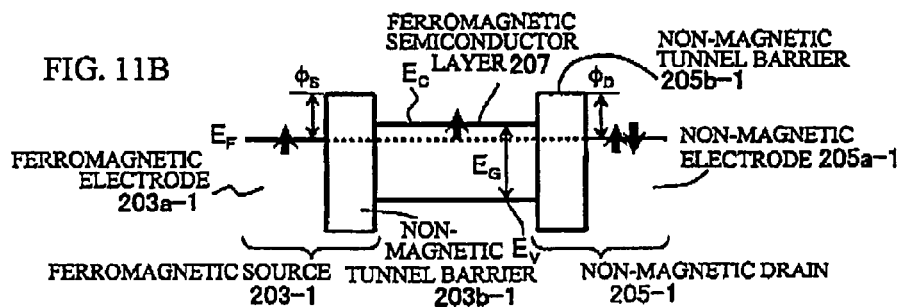
FIGS. 11B through 11D show band structures in the vicinity of the channel region of the MISFET of the seventh embodiment at the time of thermal equilibrium.
Figure 11C:
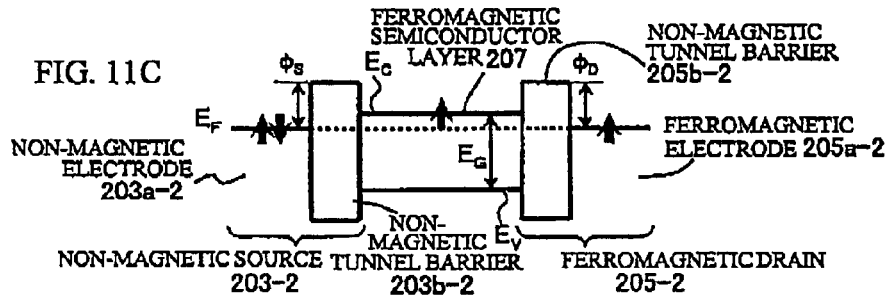
Figure 11D:
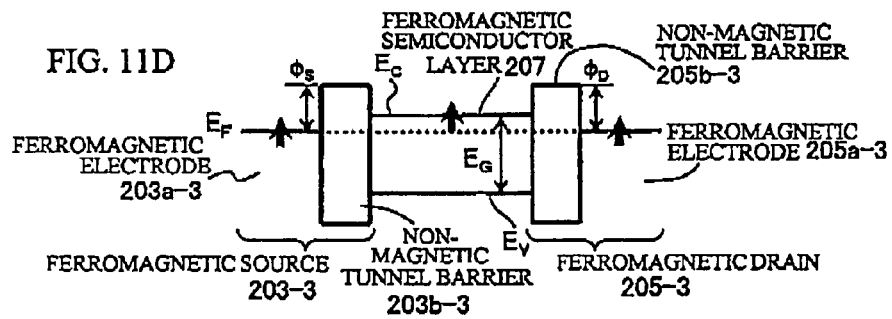

FIGS. 11B through 11D illustrate examples of the band structures in the vicinity of the channel region when the MISFET in accordance with the seventh embodiment of the present invention is in a thermal equilibrium state. Here, each ferromagnetic electrode is made of a ferromagnetic metal, and each non-magnetic electrode is made of a non-magnetic metal. The structure shown in FIG. 11B includes a ferromagnetic source 203-1 that is formed with a ferromagnetic electrode 203a-1 and a non-magnetic tunnel barrier 203b-1, and a non-magnetic drain 205-1 that is formed with a non-magnetic electrode 205a-1 and a non-magnetic tunnel barrier 205b-1. The structure shown in FIG. 11C includes a non-magnetic source 203-2 that is formed with a non-magnetic electrode 203a-2 and a non-magnetic tunnel barrier 203b-2, and a ferromagnetic drain 205-2 that is formed with a ferromagnetic electrode 205a-2 and a non-magnetic tunnel barrier 205b-2. The structure shown in FIG. 11D includes a ferromagnetic source 203-3 that is formed with a ferromagnetic electrode 203a-3 and a non-magnetic tunnel barrier 203b-3, and a ferromagnetic drain 205-3 that is formed with a ferromagnetic electrode 205a-3 and a non-magnetic tunnel barrier 205b-3. For ease of explanation, each structure is in a flat band state at the time of thermal equilibrium. The solid lines shown on the ferromagnetic source 203 and the ferromagnetic drain 205, and the dotted line shown across the ferromagnetic semiconductor layer 207 and the non-magnetic tunnel barriers 203b and 205b indicate the Fermi energy $E_F$. The band gap of the ferromagnetic semiconductor is denoted by $E_G$. The bottom of the conduction band and the top of the valence band of the semiconductor are denoted by $E_C$ and $E_V$, respectively. Hereinafter, $E_F$, $E_G$, $E_C$, and $E_V$ represent the same as above. Although the ferromagnetic semiconductor layer 207 as the channel region is not degenerated in FIGS. 11B through 11D, the ferromagnetic semiconductor layer 207 may be doped with magnetic elements at such concentration as to cause degeneracy, as described above. In an n-channel device, the non-magnetic tunnel barriers of the source and the drain are designed to form energy barriers of $\phi_S$ and $\phi_D$ in height when seen from the ferromagnetic (or non-magnetic) electrode of the source and the ferromagnetic (or non-magnetic) electrode of the drain. Those energy barriers are formed at least on the side of the conduction band. In a p-channel device, energy barriers are formed at least on the valence band side.

The arrows shown over the Fermi energy $E_F$ of the ferromagnetic electrode 203a and the non-magnetic electrode 205a indicate the directions of the major-spin electrons in the respective regions. Each upward-pointing arrow represents the up-spin direction, and each downward-pointing arrow represents the down-spin direction. The minor-spin electrons are not shown. Likewise, the arrow shown over the $E_C$ of the ferromagnetic semiconductor layer indicates the direction of the major spin. The non-magnetic electrode is represented by showing both an upward-pointing arrow and a downward-pointing arrow. In the following descriptions, those arrows shown in FIGS. 11B through 11D will be used to the same effects as above.

(2) Ferromagnetic Electrode/Intrinsic Semiconductor Tunnel Barrier

Figure 12A:
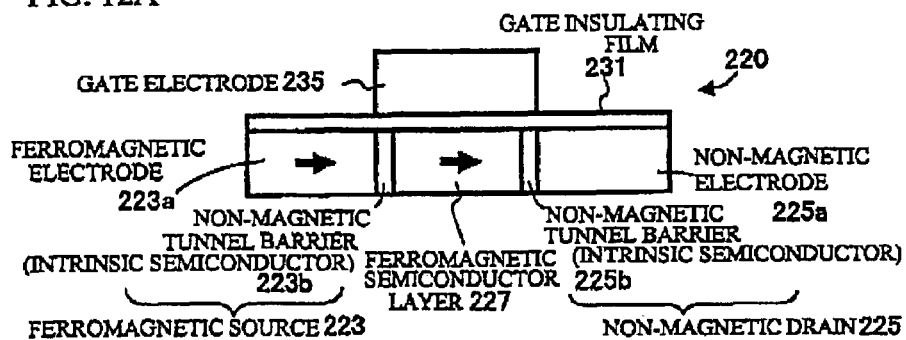
FIGS. 12A through 12D illustrate example device structures of MISFETs each having a ferromagnetic semiconductor layer as a channel region in accordance with an eighth embodiment of the present invention.

FIG. 12A illustrates the device structure of a MISFET in accordance with an eighth embodiment of the present invention. The MISFET in accordance with the eighth embodiment of the present invention differs from the MISFET in accordance with the seventh embodiment of the present invention in that the non-magnetic tunnel barriers 203b and 205b are replaced with intrinsic semiconductors (or semiconductors moderately doped with impurities). As in the MISFET in accordance with the seventh embodiment of the present invention, a ferromagnetic electrode is used for at least either one of the source and the drain. The structure shown in FIG. 12A has a ferromagnetic source and a non-magnetic drain. The structures and materials of the ferromagnetic semiconductor layer as the channel region, the ferromagnetic electrode, the non-magnetic electrode, and the substrate are the same as those of the MISFET in accordance with the seventh embodiment of the present invention. The non-magnetic tunnel barriers 223b and 225b may be formed with semiconductors that serve as host materials for the ferromagnetic semiconductor layer 227 used as the channel region. For example, if the ferromagnetic semiconductor layer as the channel region is formed with $Si_{1-x}M_x$ (M being magnetic elements), the non-magnetic tunnel barriers are formed with non-doped Si (or semiconductors moderately doped with impurities).

The MISFET in accordance with the eighth embodiment of the present invention also operates as an accumulate channel type, and the carriers may be either electrons or holes. However, the band structures in n-channel devices will be described in the following. The same structures can be used for p-channel devices.

Figure 12B:
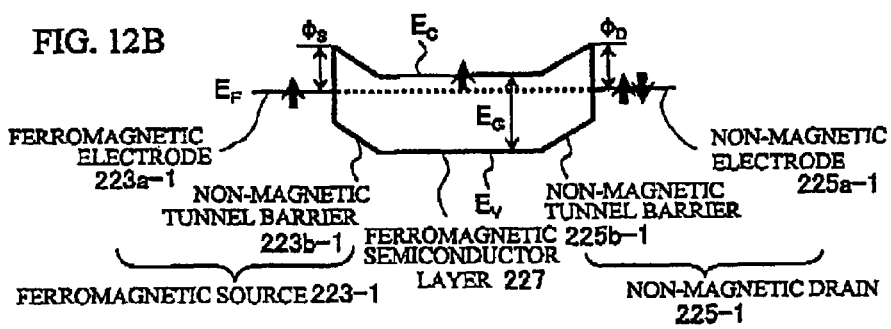
Figure 12C:
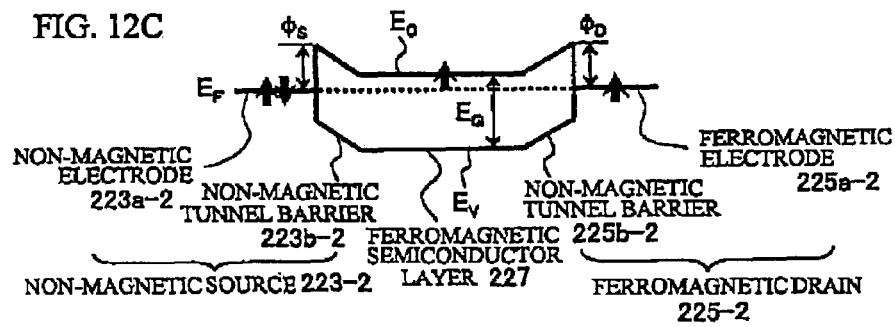
Figure 12D:
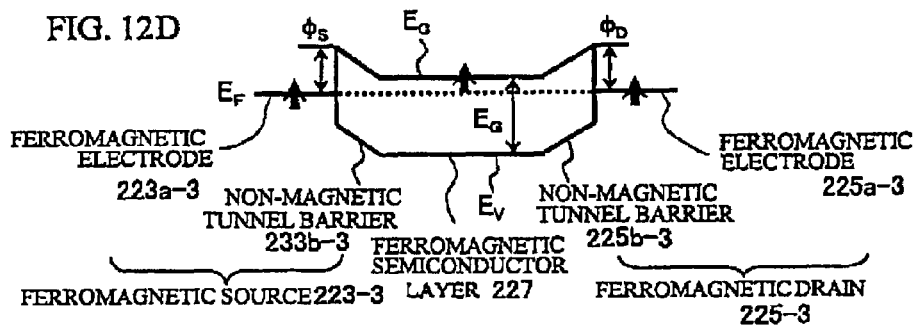

FIGS. 12B through 12D illustrate the band structures in the vicinity of the channel region when the MISFET in accordance with the eighth embodiment of the present invention is in a thermal equilibrium state. Here, each ferromagnetic electrode is made of a ferromagnetic metal, and each non-magnetic electrode is made of a non-magnetic metal. The structure shown in FIG. 12B includes a ferromagnetic source 223-1 that is formed with a ferromagnetic electrode 223a-1 and a non-magnetic tunnel barrier 223b-1, and a non-magnetic drain 225-1 that is formed with a non-magnetic electrode 225a-1 and a non-magnetic tunnel barrier 225b-1. The structure shown in FIG. 12C includes a non-magnetic source 223-2 that is formed with a non-magnetic electrode 223a-2 and a non-magnetic tunnel barrier 223b-2, and a ferromagnetic drain 225-2 that is formed with a ferromagnetic electrode 225a-2 and a non-magnetic tunnel barrier 225b-2. The structure shown in FIG. 12D includes a ferromagnetic source 223-3 that is formed with a ferromagnetic electrode 223a-3 and a non-magnetic tunnel barrier 223b-3, and a ferromagnetic drain 225-3 that is formed with a ferromagnetic electrode 225a-3 and a non-magnetic tunnel barrier 225b-3. In an n-channel device, the barriers shown in the drawings are formed with the intrinsic semiconductors of the source and the drain (however, the gap in potential caused on the interface between the ferromagnetic semiconductor layer and each intrinsic semiconductor layer is not shown), so that energy barriers of $\phi_S$ and $\phi_D$ in height can be formed on the side of the conduction band. In a p-channel device, energy barriers are formed on the valence band side.

(3) Non-Magnetic Electrode/Ferromagnetic Tunnel Barrier

Figure 13A:
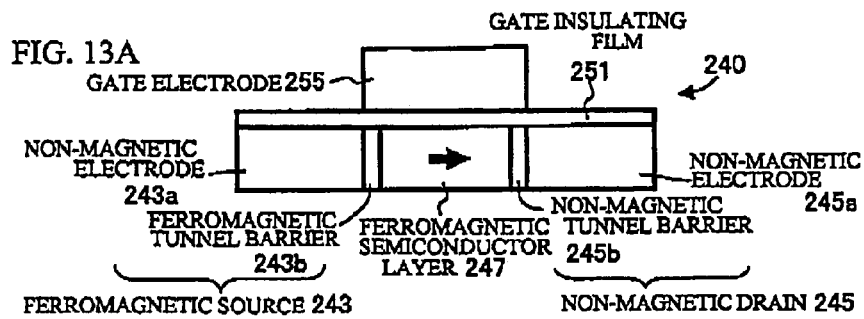
FIGS. 13A through 13D illustrate the structures of MISFETs each having a ferromagnetic semiconductor layer as a channel region in accordance with a ninth embodiment of the present invention.

FIG. 13A illustrates the device structure of a MISFET in accordance with a ninth embodiment of the present invention. The MISFET in accordance with the ninth embodiment of the present invention differs from the MISFET in accordance with the seventh embodiment of the present invention in that the non-magnetic tunnel barriers 203b and 205b (FIG. 11A) are replaced with a ferromagnetic tunnel barrier 243b and a non-magnetic tunnel barrier 245b, and the ferromagnetic electrode 203a and the non-magnetic electrode 205a (FIG. 11A) are replaced with non-magnetic electrodes 243a and 245a. Although the source and the drain in the structure shown in FIG. 13A are a ferromagnetic source and a non-magnetic drain, a ferromagnetic tunnel barrier should be employed in at least either one of the source and the drain. If a ferromagnetic tunnel barrier is employed in only either one of the source and the drain, a non-magnetic tunnel barrier is employed in the other one of the source and the drain. The structures and materials of the ferromagnetic semiconductor layer 247 as the channel region, the non-magnetic electrodes 243a and 245a, and the substrate are the same as those of the MISFET in accordance with the seventh embodiment of the present invention. The ferromagnetic tunnel barrier 243b may be formed with an insulating ferromagnetic material or an insulating ferromagnetic semiconductor. Specific examples of the materials for the ferromagnetic tunnel barrier 243b include EuS and $Gd_2O_3$. The MISFET in accordance with the ninth embodiment of the present invention also operates as an accumulate channel type, and the carriers may be either electrons or holes. However, the band structures in n-channel devices will be described in the following. The same structures can be employed for p-channel devices.

Figure 13B:
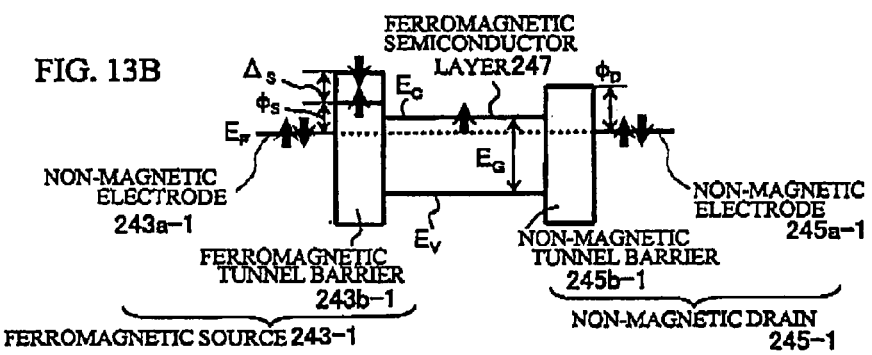
Figure 13C:
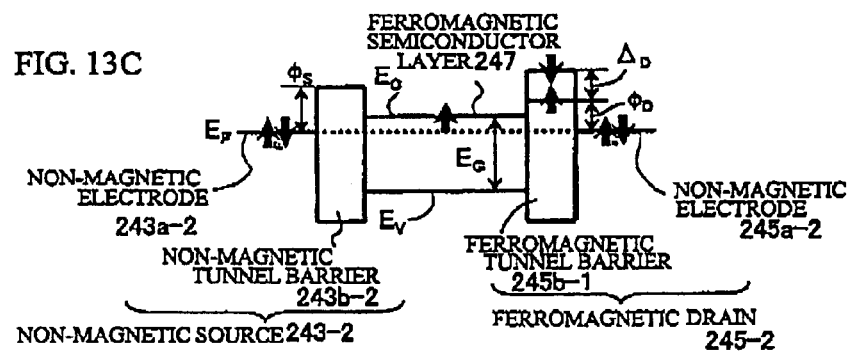
Figure 13D:
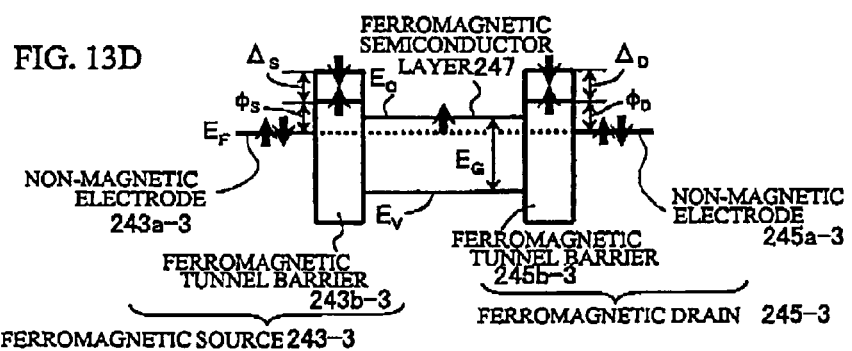

FIGS. 13B through 13D illustrate the band structures in the vicinity of the channel region when the third device structure is in a thermal equilibrium state. Here, each ferromagnetic electrode is made of a ferromagnetic metal, and each non-magnetic electrode is made of a non-magnetic metal. The structure shown in FIG. 13B includes a ferromagnetic source 243-1 that is formed with a non-magnetic electrode 243a-1 and a ferromagnetic tunnel barrier 243b-1, and a non-magnetic drain 245-1 that is formed with a non-magnetic electrode 245a-1 and a non-magnetic tunnel barrier 245b-1. The structure shown in FIG. 13C includes a non-magnetic source 243-2 that is formed with a non-magnetic electrode 243a-2 and a non-magnetic tunnel barrier 243b-2, and a ferromagnetic drain 245-2 that is formed with a non-magnetic electrode 245a-2 and a ferromagnetic tunnel barrier 245b-2. The structure shown in FIG. 13D includes a ferromagnetic source 243-3 that is formed with a non-magnetic electrode 243a-3 and a ferromagnetic tunnel barrier 243b-3, and a ferromagnetic drain 245-3 that is formed with a non-magnetic electrode 245a-3 and a ferromagnetic tunnel barrier 245b-3. At the band edges of the ferromagnetic tunnel barriers 243b-1, 245b-2, 243b-3, and 245b-3, the barrier height seen from each adjacent non-magnetic electrode depends on the spins, because of the spin split in the up-spin band and the down-spin band. In an n-channel device, the bottom of the conduction band of each ferromagnetic tunnel barrier needs to be spin-split. In a p-channel device, the top of the valence band of each ferromagnetic tunnel barrier needs to be spin-split. The two adjacent solid lines in each ferromagnetic tunnel barrier in the drawings indicate the band edges of the up-spin band and the down-spin band, and $\Delta_S$ and $\Delta_D$ indicate the spin-split width in the up-spin band and the down-spin band in each ferromagnetic tunnel barrier in the case where a ferromagnetic tunnel barrier is employed for the source and the drain. Each upward-pointing arrow and each downward-pointing arrow shown over the solid lines indicate an up-spin band edge and a down-spin band edge. The barrier height of the lower ferromagnetic tunnel barrier or the non-magnetic tunnel barrier seen from the non-magnetic electrode of the source is denoted by $\phi_S$ in the source, and the barrier height of the lower ferromagnetic tunnel barrier or the non-magnetic tunnel barrier seen from the non-magnetic electrode of the drain is denoted by $\phi_D$ in the drain.

The above described structures are the basic structures of the MISFETs in accordance with the seventh through ninth embodiments of the present invention. Each of the basic structures can be embodied by the specific structures illustrated in FIGS. 14A through 14D. The electrodes and the tunnel barriers of the sources and the drains shown in FIGS. 14A through 14D are formed with ferromagnetic materials, so that the MISFETs in accordance with the seventh through ninth embodiment of the present invention illustrated in FIGS. 11A through 13D can be embodied.

Figure 14A:
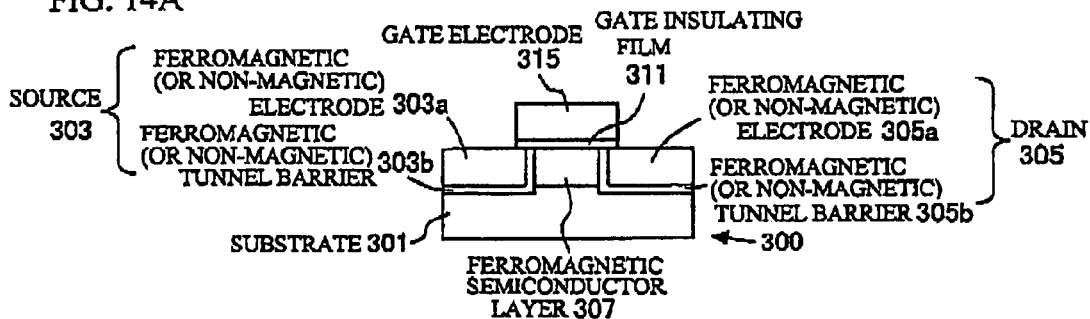
FIGS. 14A through 14D illustrate the device structures of MISFETs in accordance with tenth through thirteenth embodiments of the present invention.

FIGS. 14A through 14D illustrate MISFETs in practical forms in accordance with tenth through thirteenth embodiments of the present invention. FIG. 14A illustrates the structure of the MISFET in accordance with the tenth embodiment of the present invention. As shown in FIG. 14A, the MISFET 300 in accordance with this embodiment includes a ferromagnetic semiconductor layer 307 that is formed in an island fashion on a substrate 301, and a source and a drain formed with ferromagnetic (or non-magnetic) electrodes 303a and 305a that are separated from the ferromagnetic semiconductor layer 307 and the substrate 301 by ferromagnetic (or non-magnetic) tunnel barriers 303b and 305b.

Figure 14B:
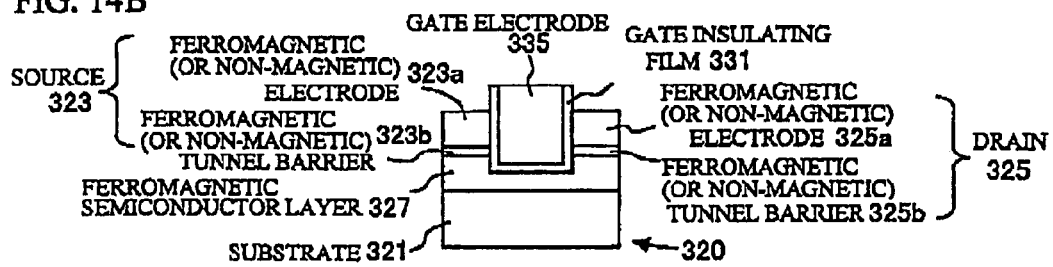

FIG. 14B illustrates a MISFET in a second practical form in accordance with the eleventh embodiment of the present invention. This is an example a three-layer structure of a ferromagnetic semiconductor layer, ferromagnetic (or non-magnetic) tunnel barriers, and ferromagnetic (or non-magnetic) electrodes. The MISFET 320 in accordance with this embodiment has a three-layer structure formed with a ferromagnetic semiconductor layer 327, a ferromagnetic (or non-magnetic) tunnel barriers 323b and 325b, and a ferromagnetic (or non-magnetic) electrodes 323b and 325b arranged in this order on a substrate 321. A concavity having a U-shape, V-shape, or the like in a section seen from one direction of the three-layer structure is formed in the three-layer structure by a lithography technique or an etching technique. An insulating film 331 and a gate electrode 335 are formed on the surfaces of the ferromagnetic semiconductor, the ferromagnetic (or non-magnetic) tunnel barrier, and the ferromagnetic (or non-magnetic) electrode, which are exposed through the concavity.

Figure 14C:
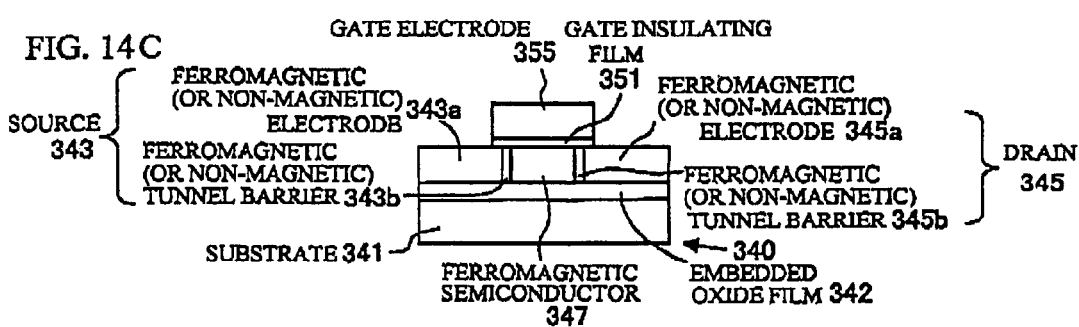

FIG. 14C illustrates a MISFET in a third practical form in accordance with the twelfth embodiment of the present invention. This MISFET is an example structure having an SOI substrate. As shown in FIG. 14C, the MISFET 340 in accordance with this embodiment includes: an SOI structure that is formed with a substrate 341 and an embedded oxide film 342 formed on the substrate 341; an island-like ferromagnetic semiconductor 347 formed on the SOI structure; a source and a drain that are formed with or non-magnetic tunnel barriers formed on the opposite side surfaces of the ferromagnetic semiconductor 347 and ferromagnetic (or non-magnetic) electrodes joined to the ferromagnetic (or non-magnetic) tunnel barriers; a gate insulating film 351 formed on the ferromagnetic semiconductor 347; and a gate electrode 355 formed on the gate insulating film 351. In the existence of the embedded oxide film 342, the tunnel barriers 343b and 345b are formed only on the side walls of the ferromagnetic semiconductor 347.

Figure 14D:
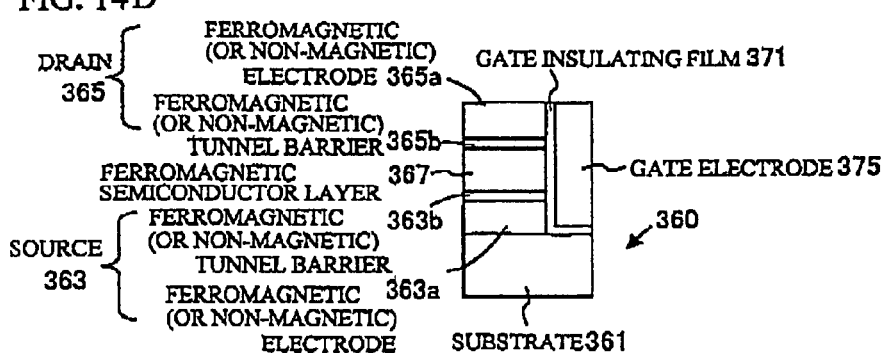

FIG. 14D illustrates a MISFET in a fourth practical form in accordance with the thirteenth embodiment of the present invention. This MISFET is an example of a vertical transistor. As shown in FIG. 14D, the MISFET in the fourth practical form includes an island-like stacked structure that is formed with a source 363, a ferromagnetic semiconductor 367, and a drain 365 formed on a substrate 361. A gate insulating film 371 and a gate electrode 373 are formed on a side wall of the stacked structure.

Next, the operation principles of the MISFET in accordance with a second aspect of the present invention are described, with reference to the accompanying drawings. While the channel region in each of the MISFETs of the seventh through thirteenth embodiments of the present invention is formed with a ferromagnetic semiconductor layer, combinations of a source and a drain include: (i) a ferromagnetic source and a non-magnetic drain; (ii) a non-magnetic source and a ferromagnetic drain; (iii) a ferromagnetic source and a ferromagnetic drain, as described above. Each ferromagnetic source or drain is formed with: (a) junction of a ferromagnetic electrode and a non-magnetic tunnel barrier; (b) junction of a ferromagnetic electrode and an intrinsic semiconductor barrier; or (c) junction of a non-magnetic electrode and a ferromagnetic tunnel barrier.

In the following, the principles of operation are described as to an n-channel device that has a ferromagnetic source formed with the junction of a ferromagnetic electrode and a non-magnetic tunnel barrier or the junction of a non-magnetic electrode and a ferromagnetic tunnel barrier. The principles of operation of a MISFET having a ferromagnetic source formed with the junction of a ferromagnetic electrode and an intrinsic semiconductor barrier are the same as those in a case of the junction of a ferromagnetic electrode and a non-magnetic tunnel barrier. The same applied to a p-channel device. If the magnetization direction of the ferromagnetic channel region is the same as the magnetization direction of the ferromagnetic source, the relative magnetization configuration is parallel. If the magnetization direction of the ferromagnetic channel region is opposite to the magnetization direction of the ferromagnetic source, the relative magnetization configuration is antiparallel. In a case where ferromagnetic tunnel barriers are employed, if the direction of the major spin in the ferromagnetic semiconductor layer is parallel to the spin direction of the spin band forming the band edge in each ferromagnetic tunnel barrier, the relative magnetization configuration is parallel. If the direction of the major spin in the ferromagnetic semiconductor layer is opposite to the spin direction of the spin band forming the band edge in each ferromagnetic tunnel barrier, the relative magnetization configuration is antiparallel. Here, a Rashba effect that is induced by the gate voltage is ignored. The channel length is sufficiently shorter than the relaxation length of spins.

Figure 15A:
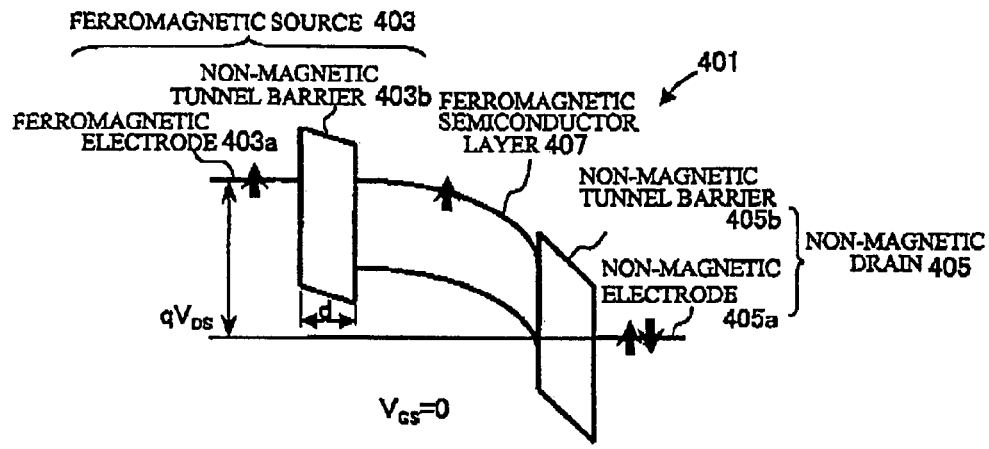
FIG. 15A illustrates the operation principles of the transistor of the seventh embodiment, showing the energy band structure in a case where a gate voltage is not applied.
Figure 15B:
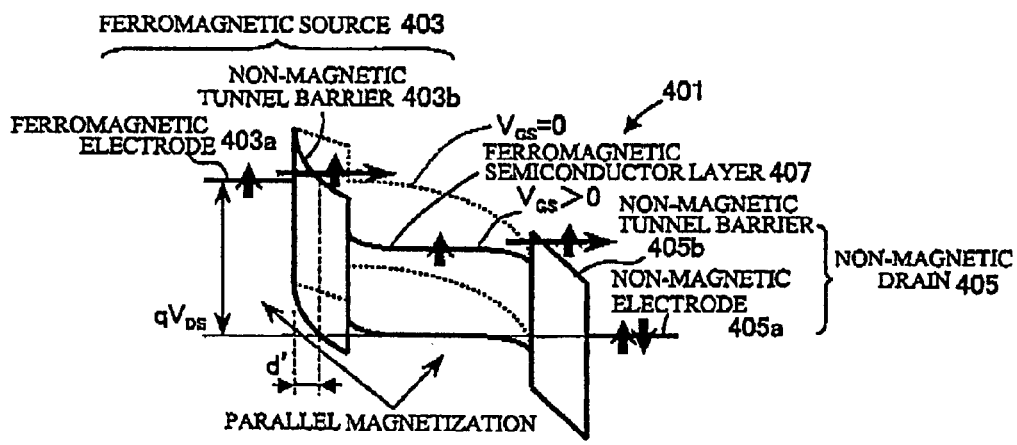
FIG. 15B illustrates the operation principles of the transistor of the seventh embodiment, showing the energy band structure in a case where a gate voltage is applied and the ferromagnetic source and the ferromagnetic semiconductor layer exhibit parallel magnetization.
Figure 15C:
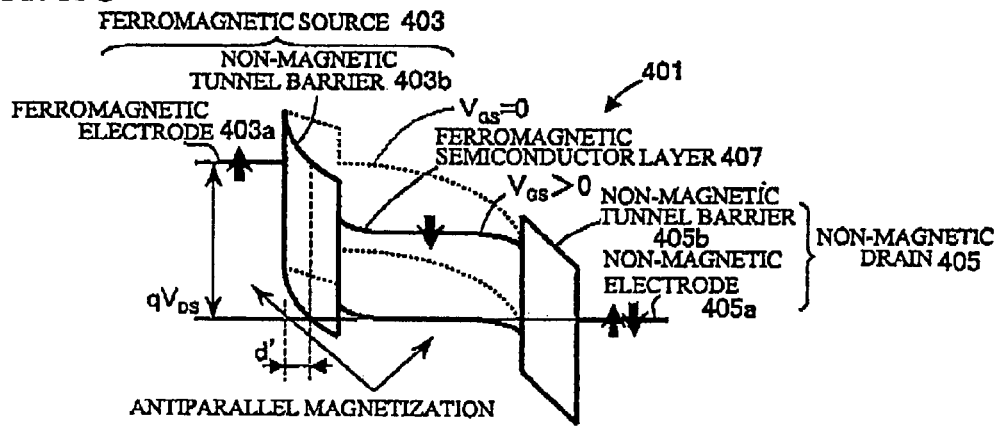
FIG. 15C illustrates the operation principles of the transistor of the seventh embodiment, showing the energy band structure in a case where a gate voltage is applied and the ferromagnetic source and the ferromagnetic semiconductor layer exhibit antiparallel magnetization.

In the following, the operation principles of a MISFET in accordance with the seventh embodiment are described. FIGS. 15A through 15C illustrate the band structures of a MISFET having a ferromagnetic source 403 formed with a ferromagnetic electrode 403a and a non-magnetic tunnel barrier 403b. FIG. 15A illustrates the band structure in a case where the gate-source bias $V_{GS}$ is set to zero, and a bias $V_{DS}$ (>0) is applied between the drain and the source. As the bias $V_{DS}$ is applied, the potential shown in FIG. 15A is formed. Since the potential of the gate electrode located in the vicinity of the drain is set to zero, the decrease in the potential of the tunnel barrier of the drain is greater than the decrease in the potential of the tunnel barrier of the source. As long as the barrier width d of the tunnel barrier of the ferromagnetic source is suitably set, electrons are hardly injected into the channel region from the ferromagnetic source due to a tunneling effect. Although a current might be generated from the conduction carriers of the ferromagnetic electrode of the ferromagnetic source that thermally cross over the barrier of $\phi_S$ in height, the current can be restricted to a sufficiently small amount by adjusting the height $\phi_S$ to a suitable value. Accordingly, when the bias $V_{GS}$ is zero, the MISFET is put into a shut-off state. This shut-off state does not depend on the relative magnetization direction between the ferromagnetic source and the ferromagnetic channel.

When a bias $V_{GS}$ (>0) is applied to the gate electrode, the electric field in the vicinity of the tunnel barrier of the ferromagnetic source is intensified by the electric flux flowing from the gate electrode to the ferromagnetic source, and the barrier width of the tunnel barrier decreases as indicated by d' in FIG. 15B. Accordingly, the potential barrier of $\phi_S$ transmits the electrons in the ferromagnetic source, and the electrons are injected into the channel region located immediately below the gate insulating film. While being drawn toward the interface between the insulator and the semiconductor by virtue of the bias $V_{GS}$, the injected electrons are transported to the drain by virtue of the bias $V_{DS}$, and then form a drain current. Here, the trans (mutual) conductance and the drain current of the MISFET 401 in accordance with this embodiment depends on the relative magnetization direction between the ferromagnetic source 403 and the ferromagnetic channel region 407.

The electrons tunneling from the ferromagnetic source 403 to the ferromagnetic channel region 407 via a tunnel barrier have the same effect as a tunneling magneto-resistance (TMR) effect (hereinafter referred to simply as the TMR effect). Accordingly, the tunnel resistance is low in a case where the ferromagnetic source 403 and the ferromagnetic channel region 407 exhibit parallel magnetization, and the tunnel resistance is high in a case of antiparallel magnetization. Even if the influence of the TMR effect is small, electrons with a spin polarization rate that depends on the spin polarization rate of the ferromagnetic material of the source can be injected from the ferromagnetic source 403. Accordingly, the electrons cause spin-dependent scattering in the ferromagnetic channel region 407, in accordance with the relative magnetization configuration between the ferromagnetic channel region 407 and the ferromagnetic source 403. Due to the TMR effect and the spin-dependent scattering in the ferromagnetic channel region at the time of tunnel injection, the trans conductance varies in accordance with the relative magnetization direction between the ferromagnetic source 403 and the ferromagnetic channel region 407.

As shown in FIG. 15B, if the ferromagnetic source 403 and the ferromagnetic channel region 407 exhibit parallel magnetization, the trans conductance and the drain current become higher. As shown in FIG. 15C, if the ferromagnetic source 403 and the ferromagnetic channel region 407 exhibit antiparallel magnetization, the trans conductance and the drain current become low.

As described above, in the MISFET in accordance with this embodiment, the trans conductance can be controlled by the relative magnetization direction between the ferromagnetic source 403 and the ferromagnetic channel region 407, even with the same bias being applied. In the MISFET 401 in accordance with this embodiment, the number of carriers to be injected into the channel region can be controlled by the bias $V_{GS}$, and accordingly, the drain current can be controlled by the bias $V_{GS}$. In this manner, the MISFET in accordance with this embodiment has the characteristics of a regular transistor that can control the drain current with the gate voltage, and can also control the trans conductance in accordance with the relative magnetization direction between the ferromagnetic source 403 and the ferromagnetic channel region 407. A MISFET having the tunnel barrier of the ferromagnetic source formed with an intrinsic semiconductor operates in the same manner as above.

Figure 16A:
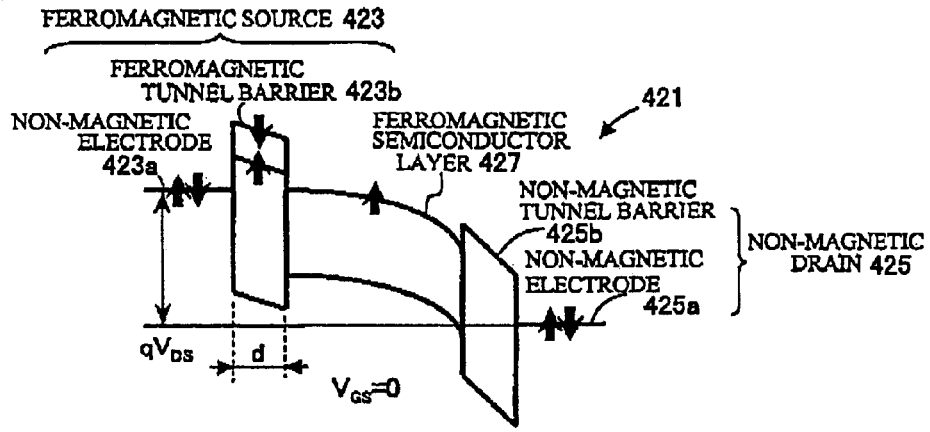
FIG. 16A illustrates the operation principles of the transistor of the ninth embodiment, showing the energy band structure in a case where a gate voltage is not applied.
Figure 16B:
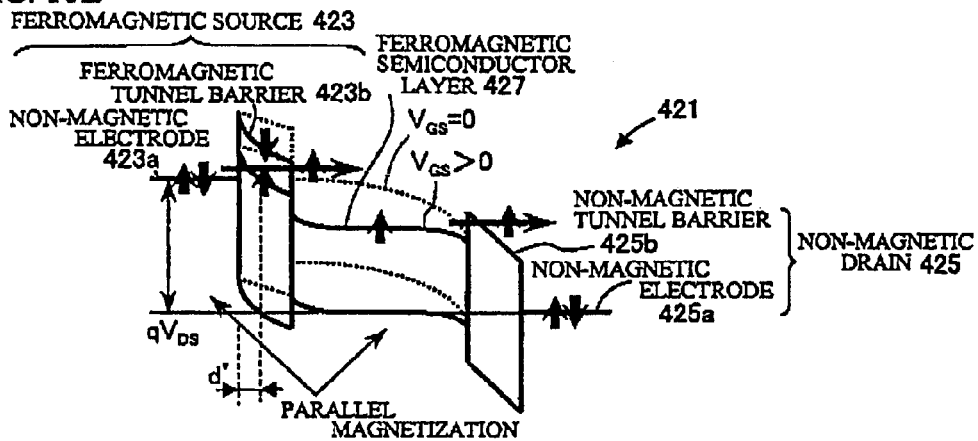
FIG. 16B illustrates the operation principles of the transistor of the ninth embodiment, showing the energy band structure in a case where a gate voltage is applied and the ferromagnetic source and the ferromagnetic semiconductor layer exhibit parallel magnetization.
Figure 16C:
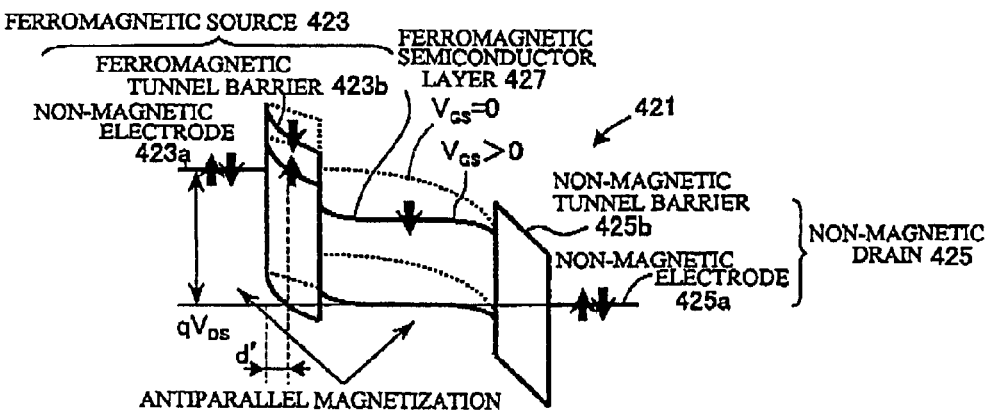
FIG. 16C illustrates the operation principles of the transistor of the ninth embodiment, showing the energy band structure in a case where a gate voltage is applied and the ferromagnetic source and the ferromagnetic semiconductor layer exhibit antiparallel magnetization.

Next, the operation principles of a MISFET in accordance with the ninth embodiment of the present invention are described. FIGS. 16A through 16C illustrate the band structures of a MISFET having a ferromagnetic source formed with a non-magnetic electrode and a ferromagnetic tunnel barrier joined to each other. FIG. 16A illustrates the band structure in a case where the gate-source bias $V_{GS}$ is set to zero, and a bias $V_{DS}$ (>0) is applied. Since the potential of the gate electrode located in the vicinity of the drain is set to zero, the decrease in the potential of the tunnel barrier of the drain is greater than the decrease in the potential of the tunnel barrier of the source. Because of the spin split in the ferromagnetic tunnel barrier 435b of the source, the barrier height varies with the directions of spin, when seen from the electrons of the non-magnetic electrode 423a of the source. In the structure shown in FIG. 16A, the barrier height is lower for the up-spin electrons than for the down-spin electrons in the non-magnetic electrode of the source. However, as long as the barrier width d of the tunnel barrier of the ferromagnetic source is suitably set, up-spin electrons are hardly injected into the channel region from the ferromagnetic source due to a tunneling effect even when the bias $V_{DS}$ (>0) is applied, with $V_{GS}$ being zero. Although a current might be generated from the carriers of the non-magnetic electrode 423a of the ferromagnetic source that thermally cross over the ferromagnetic tunnel barrier 423b, the current can be restricted to a sufficiently small amount by adjusting the barrier height $\phi_S$ to a suitable value. Accordingly, when the bias $V_{GS}$ is zero, the MISFET is put into a shut-off state. This shut-off state is not affected by the relative magnetization direction between the ferromagnetic source 423 and the ferromagnetic channel region.

When a bias $V_{GS}$ (>0) is applied to the gate electrode, the electric field in the vicinity of the ferromagnetic tunnel barrier 423b of the source is intensified by the electric flux flowing from the gate electrode to the ferromagnetic source 423, and the barrier width of the tunnel barrier 423b in relation to the up-spin electrodes decreases as indicated by d' in FIG. 16B. Accordingly, the potential barrier transmits the up-spin electrons in ferromagnetic electrode 423a of the ferromagnetic source, and the up-spin electrons are injected into the channel region located immediately below the gate insulating film. Meanwhile, the down-spin electrons in the non-magnetic electrode 423a cannot be tunnel-injected, since the barrier height $\phi_S$ is higher by the spin-split width $\Delta$. Thus, only the up-spin electrons can be injected from the ferromagnetic source 423 by virtue of the ferromagnetic tunnel barrier 423b.

While being drawn toward the interface between the insulator and the semiconductor by virtue of the bias $V_{GS}$, the injected electrons are transported to the non-magnetic drain 425 by virtue of the bias $V_{DS}$, and then form a drain current. Here, the trans (mutual) conductance and the drain current of the MISFET 421 in accordance with this embodiment depends on the relative magnetization direction between the ferromagnetic tunnel barrier 423b of the ferromagnetic source 423 and the ferromagnetic channel region 427.

The electrons tunneling from the non-magnetic electrode 423a of the ferromagnetic source 423 to the ferromagnetic channel region 427 via the ferromagnetic tunnel barrier 423b have the same effect as a tunneling magneto-resistance (TMR) effect (hereinafter referred to simply as the TMR effect). Accordingly, the tunnel resistance is low in a case where the ferromagnetic source 423 and the ferromagnetic channel region 427 exhibit parallel magnetization, and the tunnel resistance is high in a case of antiparallel magnetization. Even if the influence of the TMR effect is small, electrons with a spin polarization rate that depends on the spin polarization rate of the ferromagnetic source 423 can be injected from the ferromagnetic source 423. Accordingly, the electrons cause spin-dependent scattering in the ferromagnetic channel region 427, in accordance with the relative magnetization configuration between the ferromagnetic channel region 427 and the ferromagnetic source 223. Due to the TMR effect and the spin-dependent scattering in the ferromagnetic channel region 427 at the time of tunnel injection, the trans conductance varies in accordance with the relative magnetization direction between the ferromagnetic source 423 and the ferromagnetic channel region 427.

As shown in FIG. 16B, if the ferromagnetic source 423 and the ferromagnetic channel region 427 exhibit parallel magnetization, the trans conductance and the drain current become higher. As shown in FIG. 16C, if the ferromagnetic source 423 and the ferromagnetic channel region 427 exhibit antiparallel magnetization, the trans conductance and the drain current become low.

As described above, in the MISFET in accordance with this embodiment, the trans conductance can be controlled by the relative magnetization direction between the ferromagnetic source and the ferromagnetic channel region, even with the same bias being applied. Also, the number of carriers to be injected into the channel region can be controlled by the bias $V_{GS}$, and accordingly, the drain current can be controlled by the bias $V_{GS}$. In this manner, the MISFET in accordance with this embodiment has the characteristics of a regular transistor that can control the drain current with the gate voltage, and can also control the trans conductance in accordance with the relative magnetization direction between the ferromagnetic source and the ferromagnetic channel region.

Figure 17:
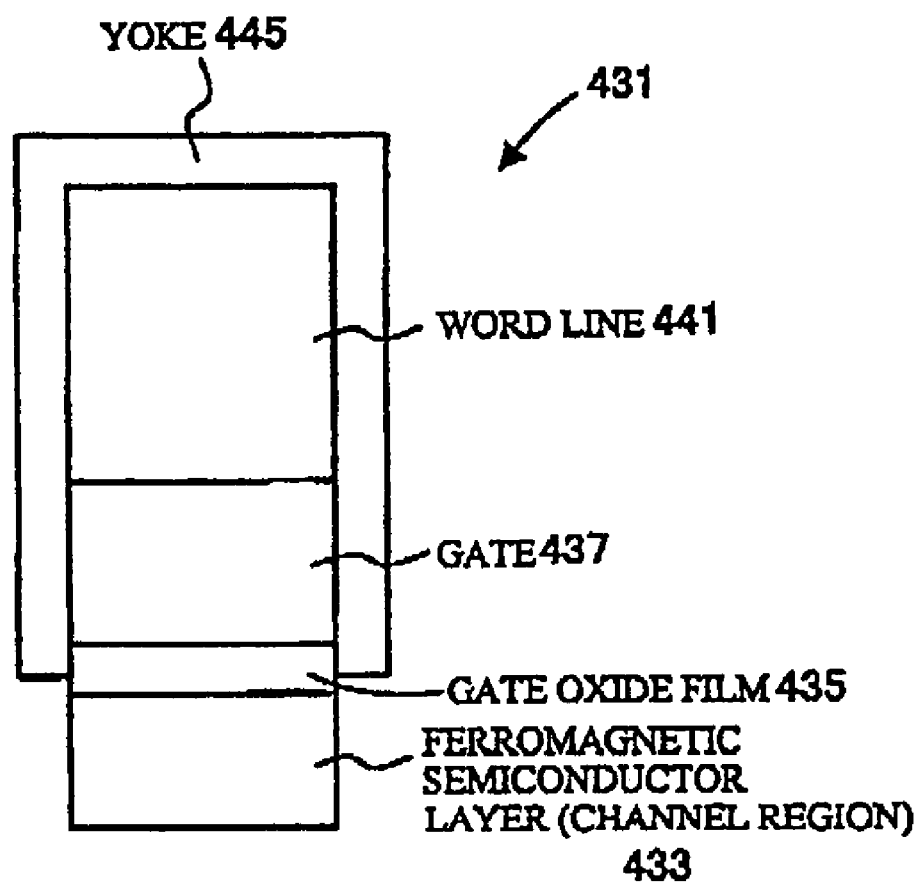
FIG. 17 illustrates a MISFET in accordance with a fourteenth embodiment of the present invention, showing a compound structure of a gate electrode and a word line utilizing a yoke.

Next, a memory cell employing a MISFET in accordance with a fourteenth embodiment of the present invention is described, with reference to the accompanying drawings. FIG. 17 illustrates a memory cell structure in accordance with this embodiment. This memory cell structure is a compound structure formed with a gate electrode and a word line, utilizing a yoke structure. FIG. 17 is a cross-sectional view of the MISFET of any of the seventh through thirteenth embodiments of the present invention, seen from the source side or the drain side. As shown in FIG. 17, the memory cell structure 431 in accordance with this embodiment includes a stacked structure and a yoke 445 that externally covers the stacked structure. The stacked structure is formed with a channel region 433, a gate oxide film 435 formed on the channel region 433, a gate electrode 437 formed on the gate oxide film 435, and a word line 441 formed on the gate electrode 437. The yoke 445 is preferably made of a high magnetic permeability material. Using the structure shown in FIG. 17, the magnetic field generated by the current of the word line 441 can be effectively applied to the ferromagnetic channel region 433, and accordingly, the write current required in the memory can be reduced.

Next, a non-volatile memory employing the MISFET of any of the foregoing embodiments is described. Each of the above described MISFETs stores binary information by switching the relative magnetization configuration of the ferromagnetic source (or the ferromagnetic drain) and the ferromagnetic channel region (ferromagnetic semiconductor layer) between parallel magnetization and antiparallel magnetization, and can detect the magnetization configuration, based on the output (the drain current) representing the relative magnetization configuration. Thus, each of the above described MISFETs can be employed in a non-volatile memory. Since a 1-bit memory cell can be formed with a single MISFET, high integration can be realized. Also, the write current, which has been a serious problem in conventional MRAMs, can be reduced by actively utilizing the magnetism control by virtue of the field effect of the ferromagnetic semiconductor used for the channel region (see Non-Patent Documents 2 and 3).

In the following, the operation principles of the above described non-volatile memory that employs an n-channel MISFET having a ferromagnetic source are described. However, the same memory operation can be performed with a MISFET of the other structures or a p-channel device. In the following description, the ferromagnetic source is a pin layer having a fixed magnetization direction, and the ferromagnetic channel region is a free layer having a varying magnetization direction.

Figure 18A:
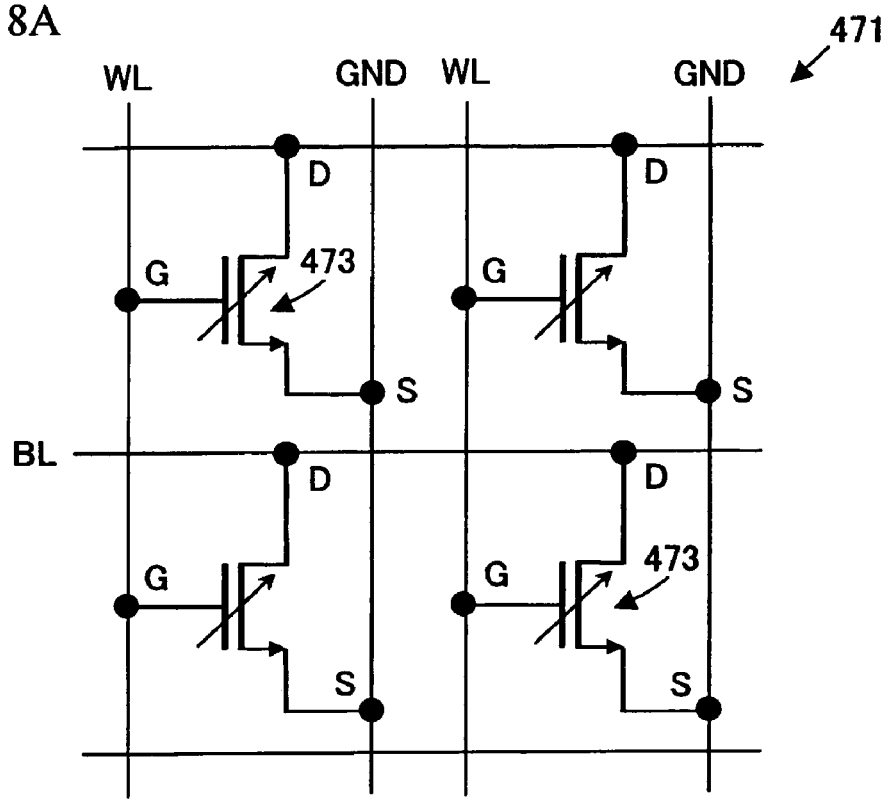
FIG. 18A illustrates an example memory cell structure of a non-volatile memory in accordance with a fifteenth embodiment of the present invention, using MISFETs of one of the seventh through fourteenth embodiments.

FIG. 18A illustrates an example structure of a non-volatile memory in accordance with a fifteenth embodiment of the present invention. As shown in FIG. 18A, a memory cell group 471 in accordance with this embodiment includes memory cells that are MISFETs 473 of one of the foregoing embodiments, word lines WL that are connected to the gate electrodes G of the MISFETs 473, bit lines BL that are connected to the drains D of the MISFETs 473, and ground lines GND that are connected to the sources of the MISFETs 473. In a rewrite operation in a selected one of the memory cells, a relatively high bias voltage ("high" in relation to the substrate potential or the gate electrode) is applied to the bit line BL and the ground line GND to which the selected cell is connected. By doing so, the number of carriers is reduced to such an extent that the ferromagnetism of the channel region vanishes and paramagnetism appears (with the coercive force becoming sufficiently small), or depletion is caused. The bit line BL and the ground line GND are arranged to cross each other at right angles as shown in FIG. 18A, so as to apply bias to the source S and the drain D only in the selected cell. In the unselected cell also connected to the bit line BL or the ground line GND, the bias is applied only to either the drain D or the source S. Therefore, the bias should be set so that the ferromagnetism cannot entirely vanish in the channel only with the bias application to either the drain or the source (for example, the region extending from the source S to the center, or the region extending from the drain D to the center, should be depleted). In this manner, the magnetization information in the unselected cells can be maintained (for example, the volume of the channel region is adjusted to such a size that a single magnetic domain structure can be easily realized).

In this situation, a relatively low current is applied to the word line WL, so as to induce a magnetic field and change the magnetization direction of the channel region in the paramagnetic state. The bias between the bit line BL and the ground line GND is then cut off, so that the channel region returns to the ferromagnetic state. Thus, the information is rewritten.

Figure 19:
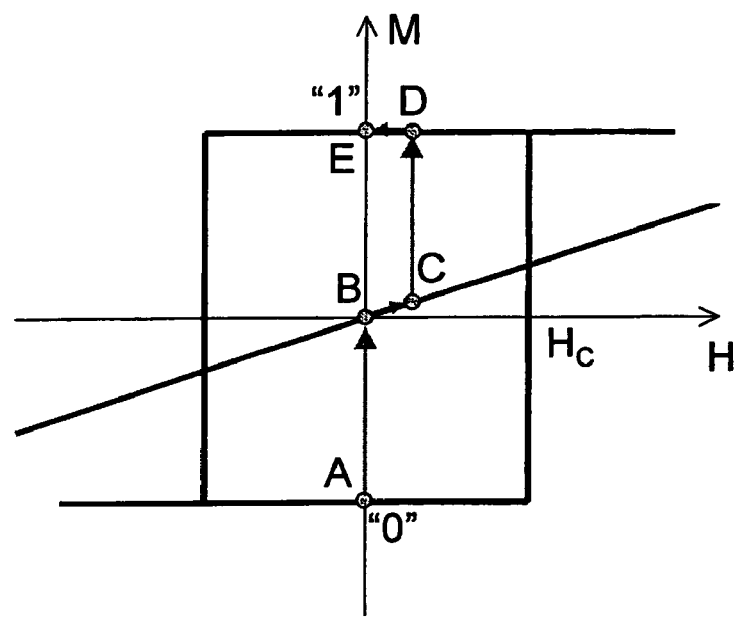
FIG. 19 shows a magnetization curve representing the principles of memory cell rewrite operation utilizing the field-effect magnetization control of the ferromagnetic semiconductor layer.

FIG. 19 illustrates the principles of the above rewrite operation, showing a magnetization curve. First, it is assumed that the magnetization of the channel region formed with a ferromagnetic semiconductor layer is represented by the point A on the magnetization curve. In this state, rewrite to the point E in FIG. 19 is to be performed. When the magnetization is represented by the point A, bias are applied to the bit line BL and the ground line GND, so that the ferromagnetism of the selected cell is changed to paramagnetism. At this point, the magnetization of the channel region is represented by the point B. A current is then applied to the word line WL connected to the gate electrode G located immediately above the channel region. With this current, the magnetization inversion to the point C in FIG. 19 can be realized, even if the intensity of the magnetic field induced by the current is smaller than the coercive force $H_C$ of the channel region in the ferromagnetic state. While the current flows in the gate electrode G, the bias applied to the source S and the drain D is cut off to return the channel region to the ferromagnetic state. At this point, the magnetization direction of the paramagnetic state is maintained as indicated by the point D in FIG. 19. The current applied to the word line WL is cut off in this situation, thereby completing the rewrite operation (represented by the point E in FIG. 19).

In the memory cell in accordance with this embodiment, magnetization inversion can be performed with a magnetic field of a lower intensity than the coercive force $H_C$ of the channel region in a ferromagnetic state. Accordingly, the current required for magnetization inversion can be greatly reduced. Also, as rewrite is performed only in the selected cell that has been put into a paramagnetic state, false rewrite cannot be often caused.

Figure 20:
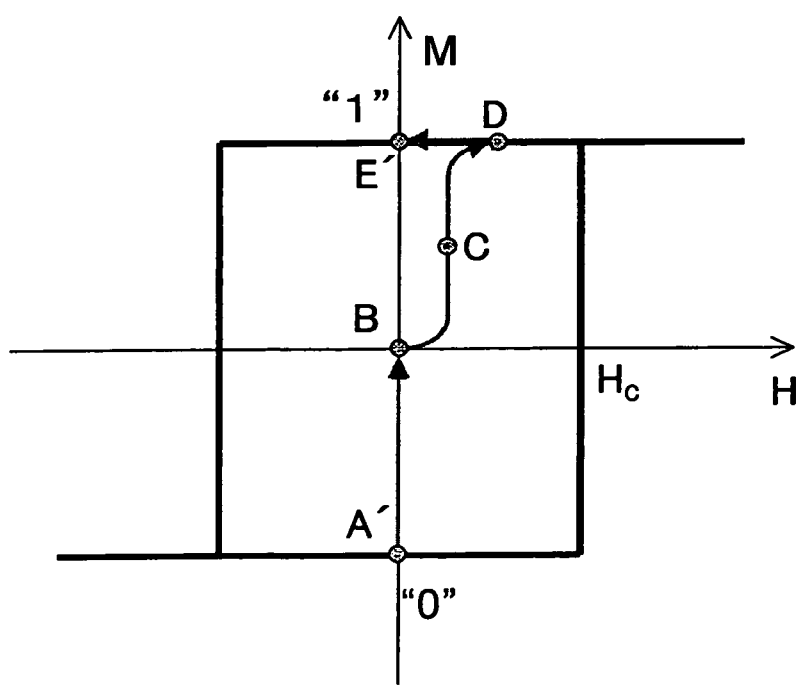
FIG. 20 shows a magnetization curve representing the principles of memory cell rewrite operation utilizing the initial magnetization characteristics of the ferromagnetic semiconductor layer.

An information rewrite operation can also be performed with low current, utilizing initial magnetization characteristics. In a ferromagnetic semiconductor, the number of carriers is reduced by a field effect to eliminate the ferromagnetism. By doing so, the ferromagnetic semiconductor can be demagnetized. As a magnetic field is induced in this situation, the magnetization curve exhibits an initial magnetization curve that is to be utilized. FIG. 20 illustrates such a rewrite operation, showing a magnetization curve. At first, the magnetization of the channel region is represented by the point A' on the magnetization curve. In this situation, rewrite to the point E' in FIG. 20 is to be performed. First, biases are applied to the bit line BL and the ground line GND, so as to reduce the number of carriers in the ferromagnetic semiconductor layer. By doing so, the ferromagnetic channel of the selected cell is demagnetized. At this point, the magnetization of the channel region is represented by the point B'. After the bias applied to the bit line BL and the ground line GND is cut off, a current is applied to the word line WL connected to the gate electrode G located immediately above the channel region, so that the magnetization along the initial magnetization curve passing through the point C' in FIG. 20 can be performed even if the intensity of the magnetic field induced by the current is smaller than the coercive force HC of the channel region in the ferromagnetic state. Thus, magnetization inversion can be performed with a magnetic field with lower intensity than HC (represented by the point D' in FIG. 20). The current to the gate electrode G is then cut off, thereby completing the rewrite operation (represented by the point E' in FIG. 20).

In an information readout operation, a bias required for a regular operation of a transistor is applied to the selected cell, and the relative magnetization configuration between the ferromagnetic source and the ferromagnetic channel region is detected based on the intensity of the drain current. Since the word line WL and the bit line BL cross each other at right angles, stored contents can be read out only from the selected cell. In the readout operation, the required bias may be applied through precharging.

Figure 18B:
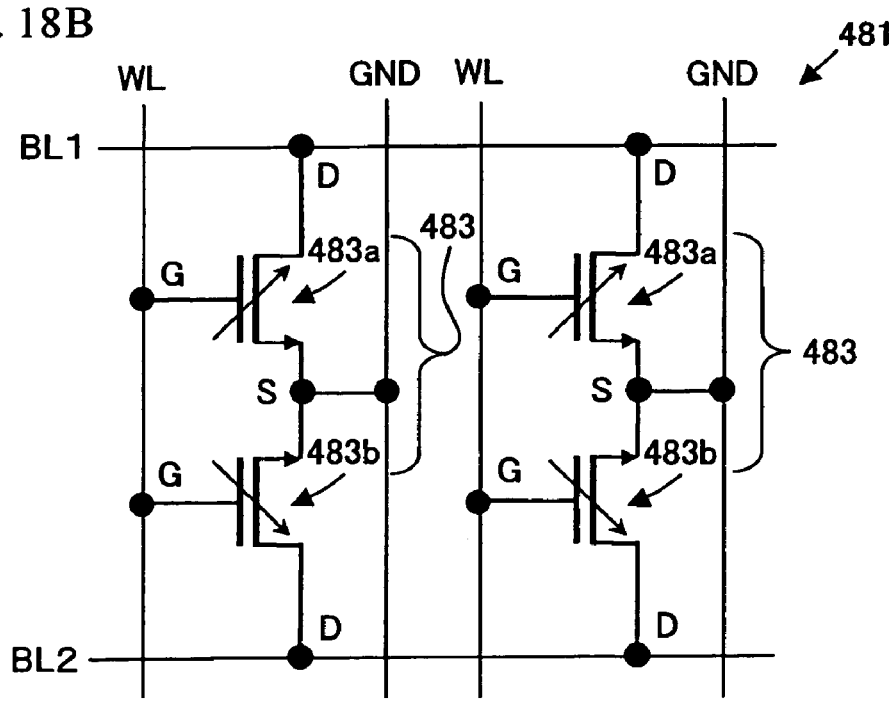
FIG. 18B illustrates an example memory cell structure of a non-volatile memory in accordance with a sixteenth embodiment of the present invention, using MISFETs of one of the seventh through fourteenth embodiments.

Next, a memory cell that employs MISFETs in accordance with a sixteenth embodiment of the present invention is described, with reference to the accompanying drawings. FIG. 18B illustrates a memory cell structure in accordance with this embodiment, using MISFETS of any of the foregoing embodiments. A memory cell group 481 in accordance with this embodiment includes memory cells 483 each having a pair of MISFETs 483a and 483b adjacent to each other in the column direction, word lines WL that are connected to the gate electrodes G of the MISFETs 483a and 483b, a first bit line BL1 connected to the drain D of each MISFET 483a, a second bit line BL2 connected to the drain D of each MISFET 483b, and ground lines GND connected to the sources S. The MISFETs 483a and 483b are MISFETs in accordance with any of the seventh through fourteenth embodiments. With the memory cell structure using MISFETs in accordance with this embodiment, a source is shared between each two adjacent MISFETs. Accordingly, the area of each cell can be effectively reduced.

Figure 21:
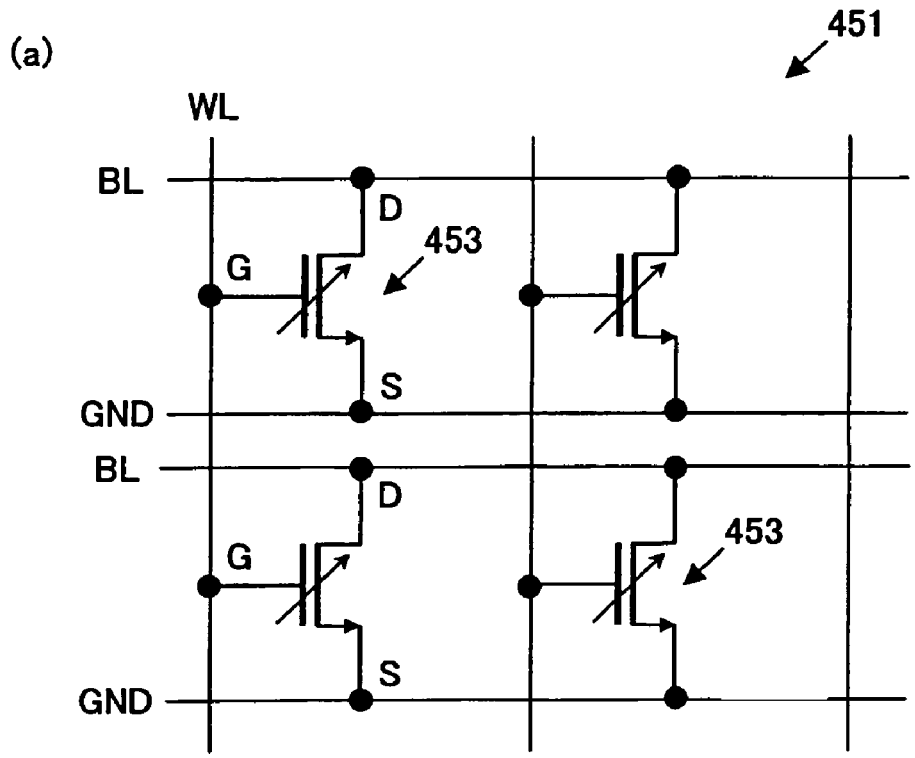
FIG. 21A illustrates a memory cell structure in accordance with a seventeenth embodiment of the present invention.
FIG. 21B illustrates a memory cell structure in accordance with an eighteenth embodiment of the present invention.
Figure 21:
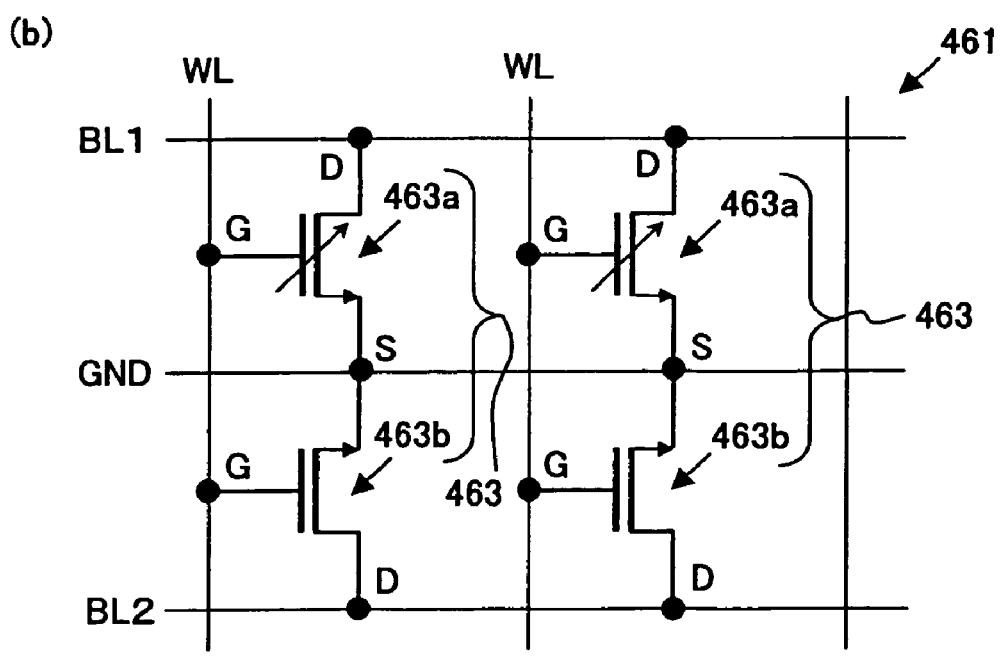

Next, a non-volatile memory in accordance with a seventeenth embodiment of the present invention is described, with reference to the accompanying drawings. FIG. 21A illustrates the non-volatile memory in accordance with this embodiment, which is an example cell structure that can collectively erase and rewrite two or more memory cells. The non-volatile memory in accordance with this embodiment includes MISFETs in accordance with any of the seventh through fourteenth embodiments of the present invention, word lines WL, bit lines BL, and ground lines GND. In this structure, the bit lines BL connected to the drains are arranged in parallel with the ground lines GND connected to the sources. In the cell structure shown in FIG. 21A, all the magnetization information stored in the MISFETs that are aligned in parallel with each other and are connected to a selected one of the bit lines can be erased and rewritten at once.

In a rewrite operation, biases are applied to the selected bit line BL and the ground line GND connected to the MISFETs connected to the selected bit line BL, and the channel regions of all the MISFETs connected to the selected bit line BL and the ground line GND are changed from a ferromagnetic state to a paramagnetic state (or a state with sufficiently small coercive force). A current in accordance with the contents of the rewrite is then applied to the word lines WL connected to the gates of the MISFETs, so that the magnetization direction of the channel region in the paramagnetic state is changed. The application of the bias to the bit line BL and the ground line GND is then cut off, thereby returning the channel region of each of the MISFETs to a ferromagnetic state. Lastly, the application of current to each word line, and the information rewrite is completed. In the memory cell structure in accordance with this embodiment, the current required for rewriting each memory cell is low, and accordingly, rewrite current can be applied simultaneously to a large number of word lines WL. Thus, the magnetization information stored in a large number of MISFETs connected to one bit line BL can be rewritten at once. In this manner, a rewrite operation can be performed at a higher speed. Since the word lines WL are perpendicular to the bit lines BL in the above described cell structure, the magnetization configuration of a selected cell can be detected based on a drain current representing the magnetization configuration, upon application of a regular bias to the selected cell. In this cell structure, it is also possible to perform a readout operation through precharging.

Also, a low-current write operation is possible with the above memory cell structure, using the initial magnetization characteristics described in conjunction with FIG. 20. In such a case, the contents of the memory cells connected to a selected bit line BL are collectively erased, and write can be performed one bit at a time. Accordingly, a rewrite method that is similar to the method employed in a flash memory can be used. More specifically, biases are applied to a selected bit line BL and the corresponding ground line GND, so that the ferromagnetic channel regions of the memory cells connected to the selected bit line BL are collectively demagnetized. After the application of biases to the bit line BL and the ground line GND is cut off, a current is sequentially applied to the word lines WL connected to the gate electrodes G of the demagnetized memory cells, thereby performing rewrite bit by bit. This rewrite method is advantageous in that the current required for each one memory cell is low, because rewrite is performed one bit at a time.

Next, a non-volatile memory in accordance with an eighteenth embodiment of the present invention is described, with reference to the accompanying drawings. The structure shown in FIG. 21B has the same structure as the memory cell structure shown in FIG. 21A, except in that each source S is shared by two adjacent MISFETs 463a and 463b aligned in the column direction, and each shared source S is connected to a ground line GND. The drains D of the two MISFETs 463a and 463b sharing one source S are connected to different bit lines BL1 and BL2. The structure illustrated in FIG. 21B is advantageous in that the area of each cell can be made smaller, and the area of the integrated circuit can also be reduced.

Although the embodiments of the present invention have been described, the present invention is not limited to those specific examples. It should be obvious to those skilled in the art that various changes and modification can be made to those embodiments.

A MISFET having a ferromagnetic semiconductor as a channel region in accordance with the present invention characteristically serves as a transistor that can control a drain current through a gate voltage, and can also control the trans conductance through the relative magnetization direction between the ferromagnetic channel region and the ferromagnetic source (or the ferromagnetic drain, or both the ferromagnetic source and the ferromagnetic drain). Accordingly, binary information can be stored in accordance with the relative magnetization direction, and the relative magnetization direction can be electrically detected. Also, using the magnetization control by virtue of the field effect of the channel region formed with a ferromagnetic semiconductor, the amount of current required for information rewrite can be greatly reduced. Accordingly, any of the above described MISFETs can form a high-performance non-volatile memory cell that is suitable for high integration.

Although the embodiments of the present invention have been described so far, the present invention is not limited to them. It should be obvious to those skilled in the art that various changes and modifications can be made to them.

INDUSTRIAL APPLICABILITY

The present invention can be applied to the non-volatile memory devices for various electronic devices, especially for portable electronic devices, which are suitable for higher integration and lower power consumption.

The invention claimed is:

1. A transistor comprising:
   a ferromagnetic semiconductor layer;
   a source that injects carriers into the ferromagnetic semiconductor layer;
   a drain that receives the carriers injected into the ferromagnetic semiconductor layer; and
   a gate electrode that applies a voltage for controlling conduction of the carriers flowing in the ferromagnetic semiconductor layer from the source to the drain,
   wherein at least one of the source and the drain comprises a tunnel barrier joined to the ferromagnetic semiconductor layer.

2. The transistor as claimed in claim 1, wherein one of the source and the drain is a ferromagnetic source or a ferromagnetic drain that comprises the tunnel barrier (a "non-magnetic tunnel barrier") that is made of a non-magnetic material and is joined to the ferromagnetic semiconductor layer, and an electrode (a "ferromagnetic electrode") that is made of a ferromagnetic material and is joined to the non-magnetic tunnel barrier.

3. The transistor as claimed in claim 1, wherein:
   the source is a ferromagnetic source; and
   the drain is a non-magnetic drain that comprises the tunnel barrier being a non-magnetic tunnel barrier, and an electrode (a "non-magnetic electrode") that is made of a non-magnetic material and is joined to the non-magnetic tunnel barrier.

4. The transistor as claimed in claim 1, wherein:
   the drain is a ferromagnetic drain; and
   the source is a non-magnetic source that comprises the tunnel barrier being a non-magnetic tunnel barrier, and a non-magnetic electrode joined to the non-magnetic tunnel barrier.

5. The transistor as claimed in claim 1, wherein the source and the drain each comprise the tunnel barrier being a non-magnetic tunnel barrier, and a ferromagnetic electrode joined to the non-magnetic tunnel barrier.

6. The transistor as claimed in claim 1, wherein:
   the tunnel barrier is a non-magnetic tunnel barrier; and
   the non-magnetic tunnel barrier is made of a semiconductor that is the base material of the ferromagnetic semiconductor layer.

7. The transistor as claimed in claim 1, wherein one of the source and the drain is a ferromagnetic source or a ferromagnetic drain that comprises the tunnel barrier (a "ferromagnetic tunnel barrier") that is made of a ferromagnetic material and is joined to the ferromagnetic semiconductor layer, and a non-magnetic electrode joined to the ferromagnetic tunnel barrier.

8. The transistor as claimed in claim 1, wherein:
   the source is a ferromagnetic source; and
   the drain is a non-magnetic drain that comprises the tunnel barrier being a non-magnetic tunnel barrier, and a non-magnetic electrode joined to the non-magnetic tunnel barrier.

9. The transistor as claimed in claim 1, wherein:
   the drain is a ferromagnetic drain; and
   the source is a non-magnetic source that comprises the tunnel barrier being a non-magnetic tunnel barrier, and a non-magnetic electrode joined to the non-magnetic tunnel barrier.

10. The transistor as claimed in claim 1, wherein the source and the drain are a ferromagnetic source and a ferromagnetic drain each comprising the tunnel barrier being a ferromagnetic tunnel barrier, and a non-magnetic electrode joined to the ferromagnetic tunnel barrier.

11. The transistor as claimed in claim 1, wherein:
    at least one of the source and the drain are a ferromagnetic source or a ferromagnetic drain that comprises the tunnel barrier being a non-magnetic tunnel barrier or a ferromagnetic tunnel barrier;
    an energy barrier due to the ferromagnetic tunnel barrier or the non-magnetic tunnel barrier is formed at least on the side of the conduction band, when the carriers are electrons; and
    the energy barrier is formed at least on the side of the valence band, when the carriers are holes.

12. The transistor as claimed in claim 1, wherein the ferromagnetic semiconductor layer is formed with a ferromagnetic semiconductor having a semiconductor including magnetic elements.

13. The transistor as claimed in claim 1, wherein:
    at least one of the source and the drain are a ferromagnetic source or a ferromagnetic drain that comprises the tunnel barrier;
    a ferromagnetic electrode is joined to the tunnel barrier; and
    the ferromagnetic source or the ferromagnetic drain comprises the ferromagnetic electrode that is a ferromagnetic metal, a ferromagnetic semiconductor, or a half-metal ferromagnetic material.

14. The transistor as claimed in claim 1, wherein:
    at least one of the source and the drain are a ferromagnetic source or a ferromagnetic drain that comprises the tunnel barrier being a ferromagnetic tunnel barrier;
    the ferromagnetic source or the ferromagnetic drain includes an insulating ferromagnetic material as the ferromagnetic tunnel barrier;
    at least the band edge of the conduction band of the insulating ferromagnetic material is spin-split, when the carriers are electrons; and
    at least the band edge of the valence band of the insulating ferromagnetic material is spin-split, when the carriers are holes.

15. The transistor as claimed in claim 1, wherein:
    at least one of the source and the drain are a ferromagnetic source or a ferromagnetic drain that comprises the tunnel barrier;
    a ferromagnetic electrode is joined to the tunnel barrier; and
    the ferromagnetic semiconductor employed for the ferromagnetic electrode is a ferromagnetic semiconductor having a semiconductor including magnetic elements.

16. The transistor as claimed in claim 1, wherein:
    at least one of the source and the drain are a ferromagnetic source or a ferromagnetic drain that comprises the tunnel barrier;
    the tunnel barrier is a non-magnetic tunnel barrier or a ferromagnetic tunnel barrier;
    a ferromagnetic electrode is joined to the tunnel barrier; and the ferromagnetic electrode is a half-metal ferromagnetic material; and the non-magnetic tunnel barrier or the ferromagnetic tunnel barrier forms an energy barrier in relation to the metallic spin band of the half-metal ferromagnetic material.

17. The transistor as claimed in claim 1, wherein an insulating layer is interposed between the gate electrode and the ferromagnetic semiconductor layer.

18. The transistor as claimed in claim 1, wherein the transistor is formed on a substrate made of a semiconductor, a substrate having a semiconductor layer formed thereon, or a substrate having an insulating layer formed thereon.

19. The transistor as claimed in claim 18, wherein:
the transistor is formed on the substrate;
the junction interface of the source and the drain in the vicinity of the gate electrode is substantially perpendicular to the principal surface of the substrate; and
the flowing direction of the carriers moving from the source to the drain is in a plane substantially parallel to the principal surface of the substrate.

20. The transistor as claimed in claim 18, wherein:
at least one of the source and the drain are a ferromagnetic source or a ferromagnetic drain that comprises the tunnel barrier;
the tunnel barrier is a non-magnetic tunnel barrier or a ferromagnetic tunnel barrier;
a ferromagnetic electrode or a non-magnetic electrode is joined to the tunnel barrier; and
the ferromagnetic electrode or the non-magnetic electrode is separated from the ferromagnetic semiconductor layer and the substrate by the non-magnetic tunnel barrier or the ferromagnetic tunnel barrier.

21. The transistor as claimed in claim 18, wherein:
the transistor is formed on the substrate;
the junction interface of the source and the drain with the ferromagnetic semiconductor is substantially parallel to the principal surface of the substrate; and
the flowing direction of the carriers moving from the source to the drain is substantially perpendicular to the principal surface of the substrate.

22. The transistor as claimed in claim 18, comprising:
a stacked structure in which the source, the ferromagnetic semiconductor, and the drain are stacked substantially in parallel with the principal surface of the substrate; and
a gate insulating film and a gate electrode that are formed on a side surface of the stacked structure.

23. The transistor as claimed in claim 22, wherein a conductive semiconductor layer formed on the substrate serves as a contact layer for the source.

24. Transistors as claimed in claim 22, wherein a conductive semiconductor layer formed on the substrate serves as a common contact layer for the sources of the transistors.

25. The transistor as claimed in claim 18, wherein:
the transistor is formed on the substrate;
the junction interface of the source and the drain with the ferromagnetic semiconductor in the vicinity of the gate electrode is substantially parallel to the principal surface of the substrate; and
the flowing direction of the carriers moving from the source to the drain is in a plane substantially parallel to the principal surface of the substrate.

26. The transistor as claimed in claim 25, wherein:
a structure in which a ferromagnetic semiconductor layer, a non-magnetic tunnel barrier, and a ferromagnetic electrode are stacked in this order, or a structure in which a ferromagnetic semiconductor layer, a ferromagnetic tunnel barrier, and a non-magnetic electrode are stacked in this order is formed on the substrate;
a concavity is formed in the substrate, the concavity having a bottom with such a depth as to reach the ferromagnetic semiconductor layer or the inside of the ferromagnetic magnetic semiconductor layer; and
a gate insulating film and a gate electrode are formed on the inner surface of the concave portion.

27. The transistor as claimed in claim 18, wherein:
the source and the drain are a ferromagnetic source and a ferromagnetic drain each comprising the tunnel barrier;
an electrode is joined to the tunnel barrier;
the electrode is a ferromagnetic electrode in the case that the tunnel barrier is a non-magnetic tunnel barrier, and the electrode is a non-magnetic electrode in the case that the tunnel barrier is a ferromagnetic tunnel barrier; and
the magnetization configuration between the ferromagnetic semiconductor layer and the ferromagnetic electrode or the ferromagnetic tunnel barrier contained in the ferromagnetic source and the ferromagnetic drain can be adjusted to parallel magnetization or antiparallel magnetization by changing the magnetization direction of the ferromagnetic semiconductor layer, with the magnetization configuration between the ferromagnetic materials contained in the ferromagnetic source and the ferromagnetic drain being fixed to parallel magnetization.

28. The transistor as claimed in claim 18, wherein:
the source and the drain are a ferromagnetic source and a ferromagnetic drain each comprising the tunnel barrier;
an electrode is joined to the tunnel barrier;
the electrode is a ferromagnetic electrode in the case that the tunnel barrier is a non-magnetic tunnel barrier, and the electrode is a non-magnetic electrode in the case that the tunnel barrier is a ferromagnetic tunnel barrier; and
the magnetization configuration between the ferromagnetic semiconductor layer and the ferromagnetic electrode or the ferromagnetic tunnel barrier contained in the ferromagnetic source and the ferromagnetic drain can be adjusted to parallel magnetization or antiparallel magnetization by changing the magnetization direction of the ferromagnetic electrode or the ferromagnetic tunnel barrier contained in the ferromagnetic source and the ferromagnetic drain.

29. The transistor as claimed in claim 1, wherein:
at least one of the source and the drain are a ferromagnetic source or a ferromagnetic drain that comprises the tunnel barrier;
an electrode is joined to the tunnel barrier;
the electrode is a ferromagnetic electrode in the case that the tunnel barrier is a non-magnetic tunnel barrier, and the electrode is a non-magnetic electrode in the case that the tunnel barrier is a ferromagnetic tunnel barrier; and
the magnetization configuration between the ferromagnetic semiconductor layer and the ferromagnetic electrode or the ferromagnetic tunnel barrier contained in the ferromagnetic source or the ferromagnetic drain can be adjusted to parallel magnetization or antiparallel magnetization by changing the magnetization direction of the ferromagnetic semiconductor layer.

30. The transistor as claimed in claim 1, wherein:
at least one of the source and the drain are a ferromagnetic source or a ferromagnetic drain that comprises the tunnel barrier;
an electrode is joined to the tunnel barrier;
the electrode is a ferromagnetic electrode in the case that the tunnel barrier is a non-magnetic tunnel barrier, and the electrode is a non-magnetic electrode in the case that the tunnel barrier is a ferromagnetic tunnel barrier; and the magnetization configuration between the ferromagnetic semiconductor layer and the ferromagnetic electrode or the ferromagnetic tunnel barrier contained in the ferromagnetic source or the ferromagnetic drain can be adjusted to parallel magnetization or antiparallel magnetization by changing the magnetization direction of the ferromagnetic electrode or the ferromagnetic tunnel barrier contained in the ferromagnetic source or the ferromagnetic drain.

31. The transistor as claimed in claim 1, wherein:

the source is a non-magnetic source or a ferromagnetic source that comprises the tunnel barrier being a non-magnetic tunnel barrier or a ferromagnetic tunnel barrier; and the injection of the carriers from the source to the ferromagnetic semiconductor layer is restricted by the ferromagnetic tunnel barrier or the non-magnetic tunnel barrier in the junction of the ferromagnetic semiconductor layer with the ferromagnetic source or the non-magnetic source, while a voltage is not applied between the gate electrode and the ferromagnetic source or the non-magnetic source.

32. The transistor as claimed in claim 1, wherein:

the source is a non-magnetic source or a ferromagnetic source that comprises the tunnel barrier being a non-magnetic tunnel barrier or a ferromagnetic tunnel barrier; and the carriers tunnel the ferromagnetic tunnel barrier or the non-magnetic tunnel barrier, and are injected into the ferromagnetic semiconductor layer, upon application of a voltage between the gate electrode and the ferromagnetic source or the non-magnetic source.

33. The transistor as claimed in claim 1, wherein:

at least one of the source and the drain are a ferromagnetic source or a ferromagnetic drain; and the magnetization configuration of the ferromagnetic semiconductor layer with respect to the ferromagnetic source or the ferromagnetic drain, or to the ferromagnetic source and the ferromagnetic drain, is parallel magnetization, a drain current is lower than a drain current generated in a case where the magnetization configuration is antiparallel magnetization.

34. A transistor comprising:

a ferromagnetic semiconductor layer;

a source that injects carriers into the ferromagnetic semiconductor layer;

a drain that receives the carriers injected into the ferromagnetic semiconductor layer; and a gate electrode that applies a voltage for controlling conduction of the carriers flowing in the ferromagnetic semiconductor layer from the source to the drain, wherein:

at least one of the source and the drain are a ferromagnetic source or a ferromagnetic drain; and transconductance can be controlled in accordance with the relative magnetization direction of the ferromagnetic semiconductor layer with respect to the ferromagnetic source or the ferromagnetic drain, or to the ferromagnetic source and the ferromagnetic drain, with the same bias being applied.

35. A transistor comprising:

a ferromagnetic semiconductor layer;

a source that injects carriers into the ferromagnetic semiconductor layer;

a drain that receives the carriers injected into the ferromagnetic semiconductor layer; and a gate electrode that applies a voltage for controlling conduction of the carriers flowing in the ferromagnetic semiconductor layer from the source to the drain, wherein:

at least one of the source and the drain are a ferromagnetic source or a ferromagnetic drain; and the magnetization configuration of the ferromagnetic semiconductor layer with respect to the ferromagnetic source or the ferromagnetic drain, or to the ferromagnetic source and the ferromagnetic drain, is parallel magnetization, a threshold voltage is set as a gate voltage for generating a predetermined current between the ferromagnetic source and the ferromagnetic drain by applying a current to the gate electrode.

36. A transistor comprising:

a ferromagnetic semiconductor layer;

a source that injects carriers into the ferromagnetic semiconductor layer;

a drain that receives the carriers injected into the ferromagnetic semiconductor layer; and a gate electrode that applies a voltage for controlling conduction of the carriers flowing in the ferromagnetic semiconductor layer from the source to the drain, wherein:

at least one of the source and the drain are a ferromagnetic source or a ferromagnetic drain;

the transistor stores information in accordance with the relative magnetization direction of the ferromagnetic semiconductor layer with respect to the ferromagnetic source or the ferromagnetic drain, or to the ferromagnetic source and the ferromagnetic drain; and the transistor detects information stored in the transistor, based on the trans conductance of the transistor that depends on the relative magnetization direction of the ferromagnetic semiconductor layer with respect to the ferromagnetic source or the ferromagnetic drain, or to the ferromagnetic source and the ferromagnetic drain.

37. The transistor as claimed in claim 36, wherein the transistor rewrites information by applying such a bias to the source and the drain that the ferromagnetic semiconductor layer exhibits paramagnetism, applying a magnetic field to the ferromagnetic semiconductor layer so as to change the magnetization direction of the ferromagnetic semiconductor layer in a paramagnetic state, and then cutting off the application of the bias to the source and the drain while the application of the magnetic field is continued or applying such a bias as to return the ferromagnetic semiconductor layer to a ferromagnetic state.

38. The transistor as claimed in claim 36, wherein the transistor rewrites information by applying such a bias to the source and the drain as to put the ferromagnetic semiconductor layer into a ferromagnetic state with sufficiently small coercive force, applying a magnetic field to the ferromagnetic semiconductor layer so as to change magnetization direction of the ferromagnetic semiconductor layer in the ferromagnetic state with the sufficiently coercive force, and then cutting off the application of the bias to the source and the drain while the application of the magnetic field is continued or applying such a bias as to return the ferromagnetic semiconductor layer to the original ferromagnetic state with greater coercive force.

39. The transistor as claimed in claim 36, wherein the transistor rewrites information by applying a bias to the source and the drain so as to demagnetize the ferromagnetic semiconductor layer, and then applying a magnetic field to the ferromagnetic semiconductor layer to utilize the initial magnetization configuration.

40. The transistor as claimed in claim 36, wherein the transistor reads out information based on a current flowing between the drain and the gate electrode, when a predetermined voltage is applied to the drain and the gate electrode, with the source being the reference.

41. A memory circuit comprising:
transistors, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a ground line that collectively grounds the sources of a first group of transistors that are selected from the transistors;
a word line that are collectively connected to the gates of the first group of transistors; and
a bit line that are connected to the drains of the first group of transistors independently of one another, and are also collectively connected to a second group of transistors including transistors that do not belong to the first group.

42. The memory element or the memory circuit as claimed in claim 41, comprising
an information rewrite unit that rewrites information stored in a transistor selected through the word line and the bit line, the rewrite being performed by applying a first voltage to the bit line and the ground line so that the ferromagnetic semiconductor layer changes from a ferromagnetic state with large coercive force to a ferromagnetic state with sufficiently small coercive force, applying a current to the word line to induce such a magnetic field as to change the magnetization direction of the ferromagnetic semiconductor layer, and then cutting off the application of the first voltage or applying a second voltage so as to return the ferromagnetic semiconductor layer to the ferromagnetic state.

43. The memory circuit as claimed in claim 41, wherein the memory circuit reads out information stored in a transistor selected through the word line and the bit line, based on the intensity of a current flowing between the word line and the ground line, when predetermined voltages are applied to the bit line and the word line, with the ground line being the reference.

44. A memory circuit comprising:
transistors, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a ground line that is collectively connected to the sources of transistor that belong to a transistor column comprising the transistors, the transistors belonging to the transistor column being aligned in one direction;
a word line that is collectively connected to the gates of the transistors that belong to the transistor column; and
bit lines that are connected to the drains of the transistors in the transistor column independently of one another.

45. The memory circuit as claimed in claim 44, comprising an information rewrite unit that rewrites information stored in a transistor selected through the word line and the bit line, the rewrite being performed by applying a first voltage to the bit line and the ground line so that the ferromagnetic semiconductor layer changes from a ferromagnetic state to a paramagnetic state, applying a current to the word line to induce such a magnetic field as to change the magnetization direction of the ferromagnetic semiconductor layer, and then cutting off the application of the first voltage or applying a second voltage so as to return the ferromagnetic semiconductor layer to the ferromagnetic state.

46. The memory circuit as claimed in claim 44, comprising an information rewrite unit that rewrites information by applying a first voltage to the bit line and the ground line so that the ferromagnetic semiconductor layer is put into to a demagnetized state, applying a current to the word line to induce such a magnetic field as to magnetize the ferromagnetic semiconductor layer, and utilizing initial magnetization characteristics after the application of the first voltage is cut off.

47. A memory circuit comprising:
transistors, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a ground line that collectively grounds the sources of a first group of transistors that are selected from the transistors;
a bit line that are collectively connected to the drains of the first group of transistors; and
a word line that are connected to the gates of the first group of transistors independently of one another, and are also collectively connected to a second group of transistors including transistors that do not belong to the first group.

48. The memory circuit as claimed in claim 47, comprising an information rewrite unit that collectively rewrites information stored in the transistors that are connected to the bit line and the ground line and are also connected to the word lines to which a current is applied, the rewrite being performed by applying a first voltage to the bit line and the ground line so that the ferromagnetic semiconductor layer changes from a ferromagnetic state with large coercive force to a paramagnetic state, applying the current simultaneously to the word lines to induce such a magnetic field as to change the magnetization direction of the ferromagnetic semiconductor layer, and then cutting off the application of the first voltage or applying a second voltage so as to return the ferromagnetic semiconductor layer to the ferromagnetic state.

49. The memory circuit as claimed in claim 47, comprising an information rewrite unit that collectively rewrites information stored in the transistors that are connected to the bit line and the ground line and are also connected to the word lines to which a current is applied, the rewrite being performed by applying a first voltage to the bit line and the ground line so that the ferromagnetic semiconductor layer changes from a ferromagnetic state with large coercive force to a ferromagnetic state with sufficiently small coercive force, applying the current simultaneously to the word lines to induce such a magnetic field as to change the magnetization direction of the ferromagnetic semiconductor layer, and then cutting off the application of the first voltage or applying a second voltage so as to return the ferromagnetic semiconductor layer to the ferromagnetic state.

50. The memory circuit as claimed in claim 47, comprising an information rewrite unit that rewrites information by applying a first voltage to the bit line and the ground line so that the ferromagnetic semiconductor layer is put into to a demagnetized state, and applying a current to the word lines to induce such a magnetic field as to magnetize the ferromagnetic semiconductor layer utilizing initial magnetization characteristics after the application of the first voltage is cut off.

51. The memory circuit as claimed in claim 47, wherein the memory circuit reads out information stored in a transistor selected through the word line and the bit line, based on the size of a current flowing between the word line and the ground line, when predetermined voltages are applied to the bit line and the word line, with the ground line being the reference.

52. A memory circuit comprising:
transistors being arranged in a matrix fashion, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
ground lines that are collectively connected to the sources of the transistors aligned in a column direction;
word lines that are collectively connected to the gate electrodes of the transistors aligned in the column direction; and
bit lines that are collectively connected to the drains of the transistors aligned in a row direction.

53. A memory circuit comprising:
a first transistor and a second transistor being adjacent to each other, each of the first and the second transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a word line that is respectively connected to the gate electrode of the first transistor and the gate electrode of the second transistor;
a first bit line that is connected to the drain of the first transistor;
a second bit line that is connected to the drain of the second transistor;
a source that is shared between the first and second transistors; and
a line that grounds the shared source, and extends in a direction perpendicular to the bit lines.

54. A memory circuit comprising:
transistors, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a ground line that is collectively connected to the sources of transistor that belong to a transistor row comprising the transistors, the transistors belonging to the transistor row being aligned in one direction;
a bit line that is collectively connected to the drains of the transistors that belong to the transistor row; and word lines that are connected to the gates of the transistors in the transistor row independently of one another.

55. A memory circuit comprising:
transistors being arranged in a matrix fashion, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
ground lines that are collectively connected to the sources of the transistors aligned in a row direction;
word lines that are respectively connected to the gate electrodes of the transistors aligned in a column direction; and
bit lines that are collectively connected to the drains of the transistors aligned in the row direction.

56. A memory circuit comprising:
transistors being arranged in a matrix fashion, each of the transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
ground lines that are collectively connected to the sources of the transistors aligned in a row direction;
word lines that are collectively connected to the gate electrodes of the transistors aligned in a column direction; and
bit lines that are collectively connected to the drains of the transistors aligned in the row direction,
ground lines adjacent to each other in the column direction being formed by one line among the ground lines.

57. A memory circuit comprising:
a first transistor and a second transistor being adjacent to each other, each of the first and the second transistors including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;
a word line that is collectively connected to the gate electrode of the first transistor and the gate electrode of the second transistor;
a first bit line that is connected to the drain of the first transistor;
a second bit line that is connected to the drain of the second transistor;
a source that is shared between the first and second transistors; and
a line that grounds the shared source, and extends in a direction parallel to the bit lines.

58. A memory element comprising:
a transistor including a ferromagnetic semiconductor layer, a source that injects carriers into the ferromagnetic semiconductor layer, a drain that receives the carriers injected into the ferromagnetic semiconductor layer, and a gate electrode that applies a voltage for controlling conduction of the carriers flowing in the ferromagnetic semiconductor layer from the source to the drain;

a first line that is connected to the gate electrode;

a second line that is connected to the drain; and a third line that grounds the source.

59. The memory element as claimed in claim 58, comprising an information rewrite unit that rewrites information by applying a first voltage to the second line and the third line so that the ferromagnetic semiconductor layer changes from a ferromagnetic state with large coercive force to a paramagnetic state, applying a current to the first line to induce such a magnetic field as to change the magnetization direction of the ferromagnetic semiconductor layer, and then cutting off the application of the first voltage or applying a second voltage so as to return the ferromagnetic semiconductor layer to the ferromagnetic state.

60. The memory element as claimed in claim 58, comprising an information rewrite unit that rewrites information by applying a first voltage to the second line and the third line so that the ferromagnetic semiconductor layer changes from a ferromagnetic state with large coercive force to a ferromagnetic state with sufficiently small coercive force, applying a current to the first line to induce such a magnetic field as to change the magnetization direction of the ferromagnetic semiconductor layer, and then cutting off the application of the first voltage or applying a second voltage so as to return the ferromagnetic semiconductor layer to the ferromagnetic state with the large coercive force.

61. The memory element as claimed in claim 58, comprising an information rewrite unit that rewrites information by applying a first voltage to the second line and the third line so that the ferromagnetic semiconductor layer is put into to a demagnetized state, and applying a current to the first line to induce such a magnetic field as to magnetize the ferromagnetic semiconductor layer utilizing initial magnetization characteristics after the application of the first voltage is cut off.

62. The memory element as claimed in claim 58, wherein the memory element reads out information, based on a current flowing between the second line and the third line, when predetermined voltages are applied to the second line and the first line, with the third line being the reference.

63. The memory element or the memory circuit as claimed in claim 58, further comprising:

a word line that is collectively connected to the gates of transistors; and a yoke that surrounds the outer periphery of the word line or the first line.

* * * * *